(12) United States Patent
Chung et al.

(10) Patent No.: US 11,342,268 B2
(45) Date of Patent: May 24, 2022

(54) SEMICONDUCTOR DEVICES AND METHODS OF MANUFACTURING SEMICONDUCTOR DEVICES

(71) Applicant: Amkor Technology Singapore Holding Pte. Ltd., Singapore OT (SG)

(72) Inventors: Ji Young Chung, Gyeonggi-Do (KR); Seung Chul Jang, Jeollanam-do (KR); Ron Huemoeller, Gilbert, AZ (US)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 32 days.

(21) Appl. No.: 16/775,648

(22) Filed: Jan. 29, 2020

(65) Prior Publication Data

US 2021/0233848 A1    Jul. 29, 2021

(51) Int. Cl.
*H01L 23/538* (2006.01)
*H01L 25/10* (2006.01)
*H01L 25/065* (2006.01)
*H01L 25/00* (2006.01)
*H01L 23/552* (2006.01)

(52) U.S. Cl.
CPC ...... *H01L 23/5381* (2013.01); *H01L 23/5383* (2013.01); *H01L 23/5386* (2013.01); *H01L 23/5387* (2013.01); *H01L 23/552* (2013.01); *H01L 25/0652* (2013.01); *H01L 25/105* (2013.01); *H01L 25/50* (2013.01); *H01L 2225/0651* (2013.01); *H01L 2225/06513* (2013.01); *H01L 2225/06517* (2013.01); *H01L 2225/06537* (2013.01); *H01L 2225/06541* (2013.01); *H01L 2225/06586* (2013.01)

(58) Field of Classification Search
CPC .............. H01L 23/5381; H01L 23/5383; H01L 23/8386; H01L 23/5387; H01L 23/552; H01L 25/0652; H01L 25/105; H01L 25/50; H01L 2225/0651; H01L 2225/06513; H01L 2225/06517; H01L 2225/06537; H01L 2225/06541; H01L 2225/06586

See application file for complete search history.

(56) References Cited

U.S. PATENT DOCUMENTS

| | | | |
|---|---|---|---|
| 6,169,328 B1 * | 1/2001 | Mitchell | ............ H01L 21/56 257/675 |
| 2005/0046001 A1 * | 3/2005 | Warner | ............ H01L 23/645 257/678 |
| 2019/0067169 A1 * | 2/2019 | Yu | ............ H01L 23/5389 |
| 2021/0057346 A1 * | 2/2021 | Tsai | ............ H01L 23/367 |

* cited by examiner

*Primary Examiner* — Timor Karimy
(74) *Attorney, Agent, or Firm* — Spectrum IP Law Group LLC

(57) ABSTRACT

In one example, an electronic assembly comprises a first semiconductor device and a second semiconductor device. Each of the first semiconductor device and the second semiconductor devices comprises a substrate comprising a top surface and a conductive structure, an electronic component over the top surface of the substrate, a dielectric material over the top surface of the substrate and contacting a side of the electronic component, a substrate tab at an end of substrate and not covered by the dielectric material, wherein the conductive structure of the substrate is exposed at the substrate tab, and an interconnect electrically coupled to the conductive structure at the substrate tab of the first semiconductor device and the conductive structure at the substrate tab of the second semiconductor device. Other examples and related methods are also disclosed herein.

11 Claims, 31 Drawing Sheets

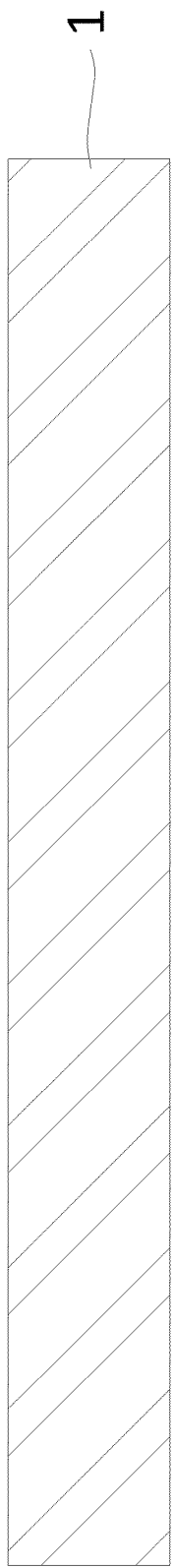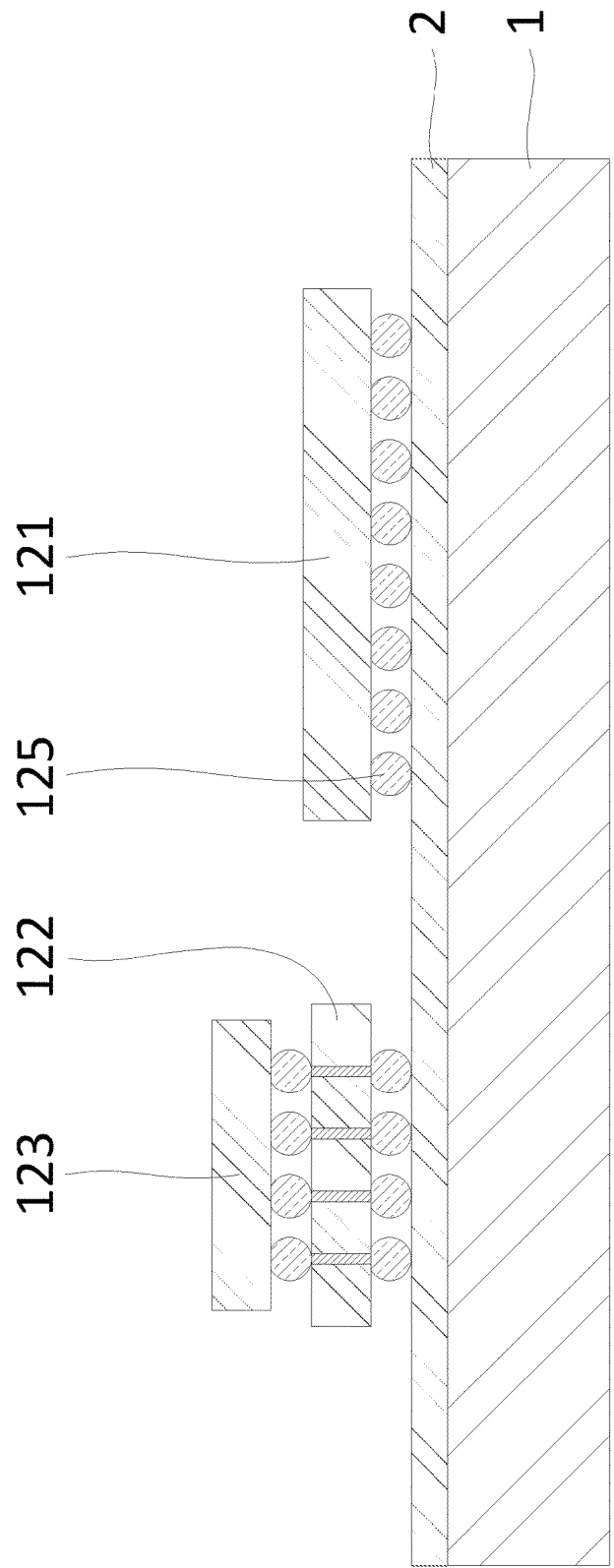

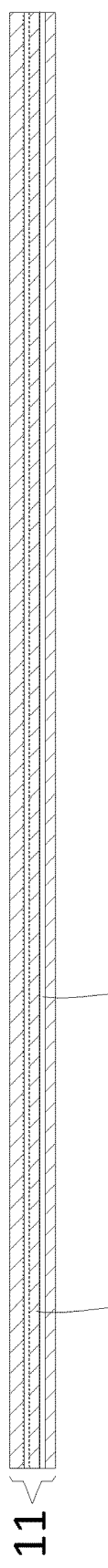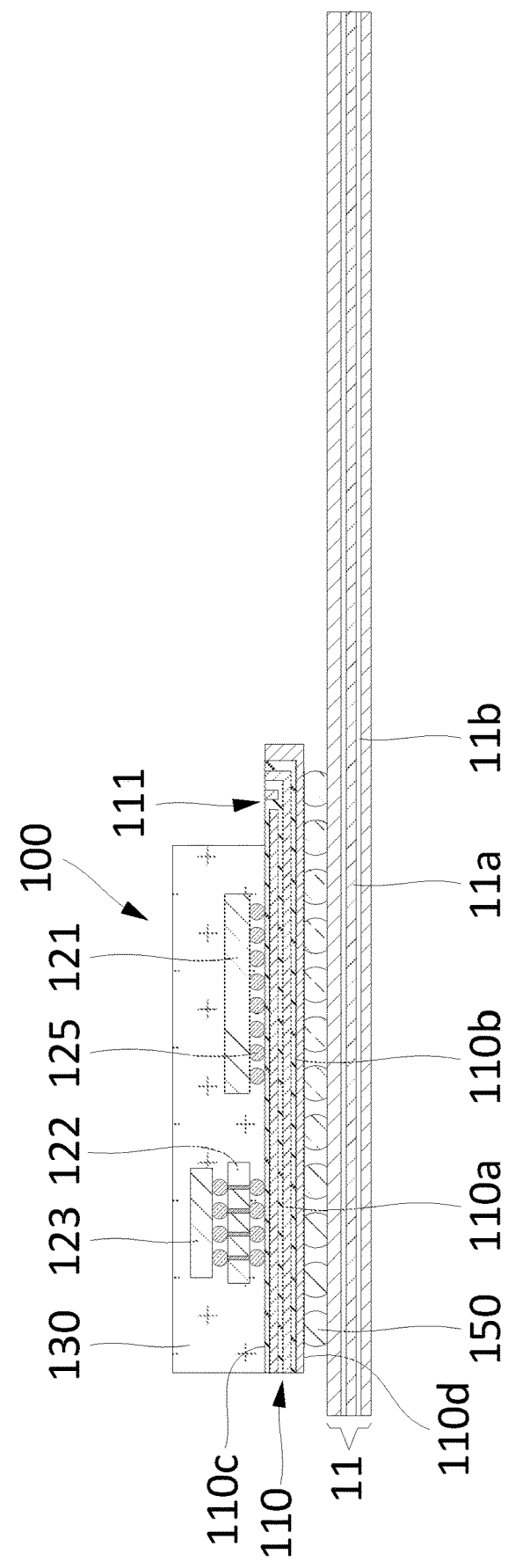
FIG.5A
FIG.5B

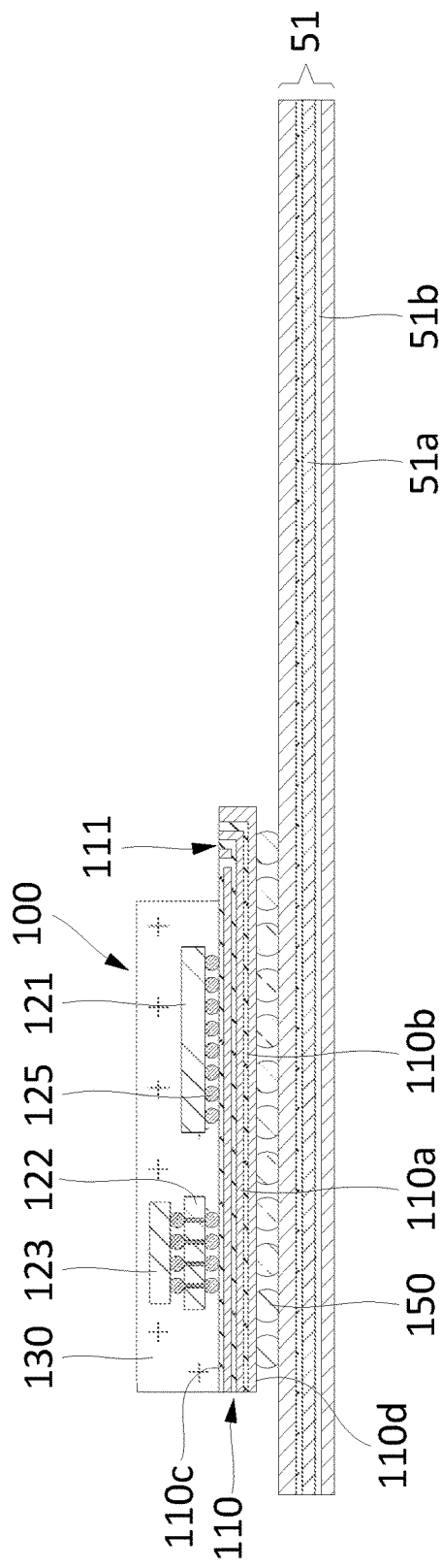
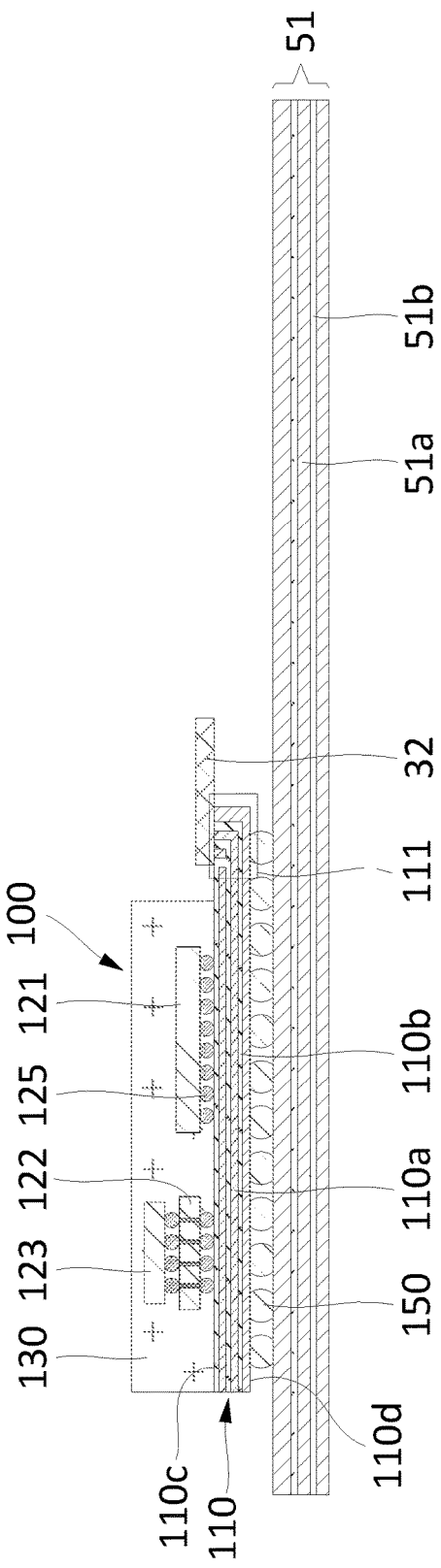
FIG.15A
FIG.15B

SEMICONDUCTOR DEVICES AND METHODS OF MANUFACTURING SEMICONDUCTOR DEVICES

TECHNICAL FIELD

The present disclosure relates, in general, to electronic devices, and more particularly, to semiconductor devices and methods for manufacturing semiconductor devices.

BACKGROUND

Prior semiconductor packages and methods for forming semiconductor packages are inadequate, for example resulting in excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

BRIEF DESCRIPTION OF THE DRAWINGS

FIG. 3A to 3F show cross-sectional views of an example method for manufacturing an example semiconductor device.

FIGS. 5A to 5D show cross-sectional views of an example method for manufacturing an example electronic assembly.

FIGS. 15A to 15E show cross-sectional views of an example method for manufacturing an example electronic assembly.

Figure 1:
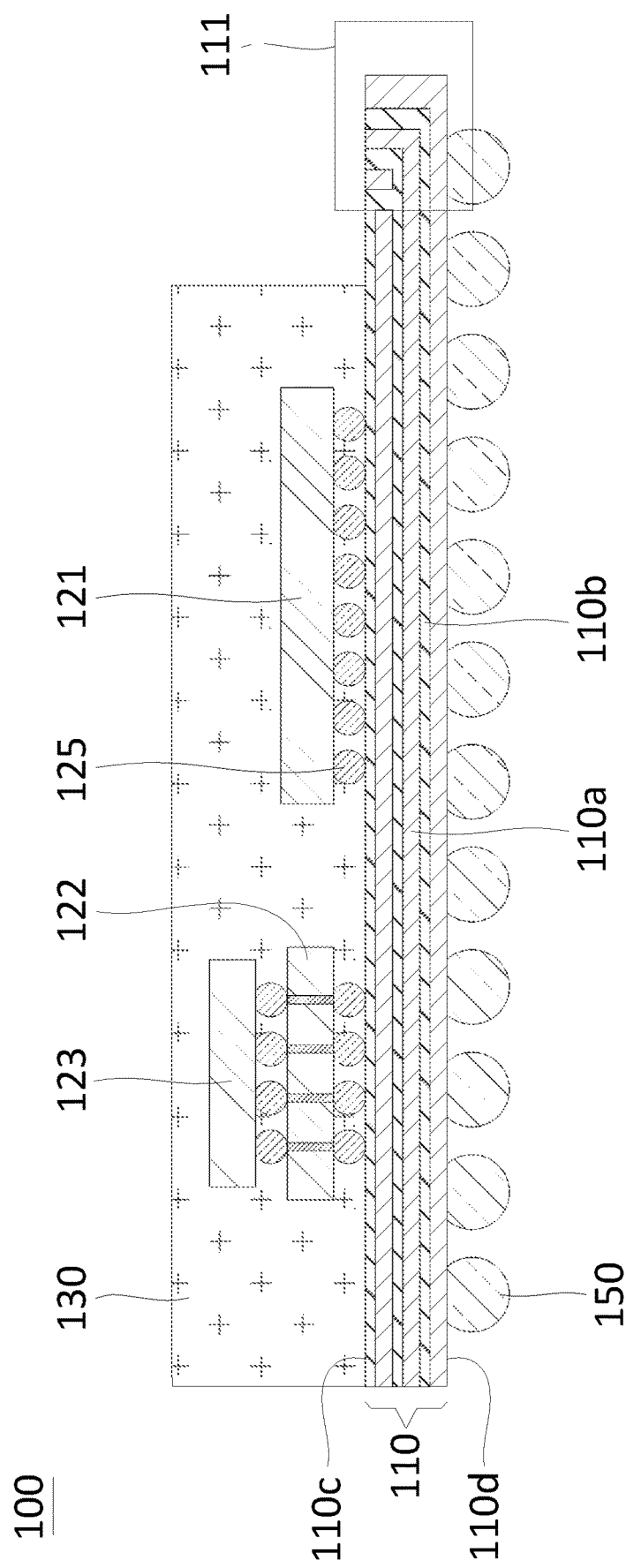
FIG. 1 shows a cross-sectional view of an example semiconductor device.

The following discussion provides various examples of semiconductor devices and methods of manufacturing semiconductor devices. Such examples are non-limiting, and the scope of the appended claims should not be limited to the particular examples disclosed. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or". As an example, "x or y" means any element of the three-element set $\{(x), (y), (x, y)\}$. As another example, "x, y, or z" means any element of the seven-element set $\{(x), (y), (z), (x, y), (x, z), (y, z), (x, y, z)\}$. The terms "comprises," "comprising," "includes," or "including," are "open ended" terms and specify the presence of stated features, but do not preclude the presence or addition of one or more other features. The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or describe two elements indirectly connected by one or more other elements. For example, if element A is coupled to element B, then element A can be directly contacting element B or indirectly connected to element B by an intervening element C. Similarly, the terms "over" or "on" may be used to describe two elements directly contacting each other or describe two elements indirectly connected by one or more other elements.

DESCRIPTION

In one example, an electronic assembly comprises a first semiconductor device and a second semiconductor device. Each of the first semiconductor device and the second semiconductor devices comprises a substrate comprising a top surface and a conductive structure, an electronic component over the top surface of the substrate, a dielectric material over the top surface of the substrate and contacting a side of the electronic component, a substrate tab at an end of substrate and not covered by the dielectric material, wherein the conductive structure of the substrate is exposed at the substrate tab, and an interconnect electrically coupled to the conductive structure at the substrate tab of the first semiconductor device and the conductive structure at the substrate tab of the second semiconductor device.

In another example, a method of manufacturing a semiconductor device or an assembly of semiconductor devices comprises providing a first electronic component over a top surface of a first substrate, wherein the first substrate comprises a first conductive structure coupled to the first electronic component, the first substrate has a first substrate tab on the top surface, and the first conductive structure is exposed at the first substrate tab, and providing a first dielectric structure over the top surface of the first substrate, wherein the first dielectric structure contacts a side of the first electronic component and the first substrate tab is not covered by the first dielectric structure.

In a further example, a method of manufacturing a semiconductor device or an assembly of semiconductor devices comprises providing a first semiconductor device and a second semiconductor device. Providing each of the first semiconductor device and the second semiconductor devices comprises providing a substrate comprising a top surface and a conductive structure, providing an electronic component over the top surface of the substrate, providing a substrate tab at an end of substrate, wherein the conductive structure of the substrate is exposed at the substrate tab, and providing an interconnect electrically coupled to the conductive structure at the substrate tab of the first semiconductor device and the conductive structure at the substrate tab of the second semiconductor device.

Other examples are included in the present disclosure. Such examples may be found in the figures, in the claims, or in the description of the present disclosure.

FIG. 1 shows a cross-sectional view of an example semiconductor device 100. In the example shown in FIG. 1, semiconductor device 100 can comprise a substrate 110, electronic components 121, 122, or 123, a dielectric 130, and external interconnects 150.

In some examples, substrate 110 can comprise dielectric structure 110a, conductive structure 110b, and substrate tab 111. Substrate 110 can comprise a top surface 110c and a bottom surface 110d opposite to top surface 110c. In some examples, dielectric material 130 can be over the top surface 110c of substrate 110 and can contact a side of one or more of electronic components 121, 122, or 123. One or more electronic components 121, 122, or 123 can be over a top surface of substrate 110. Substrate 110, dielectric 130, and external interconnects 150 can be referred to as semiconductor package or package, and can protect electronic components 121, 122, or 123 from external elements or environmental exposure. In some examples, the semiconductor package can provide electrical connection between external components and electronic components 121, 122, or 123. In some examples, substrate tab 111 can be at an end of substrate 110 and not covered by dielectric material 130. Conductive structure 110b can be exposed at substrate tab 111.

Figure 2A:
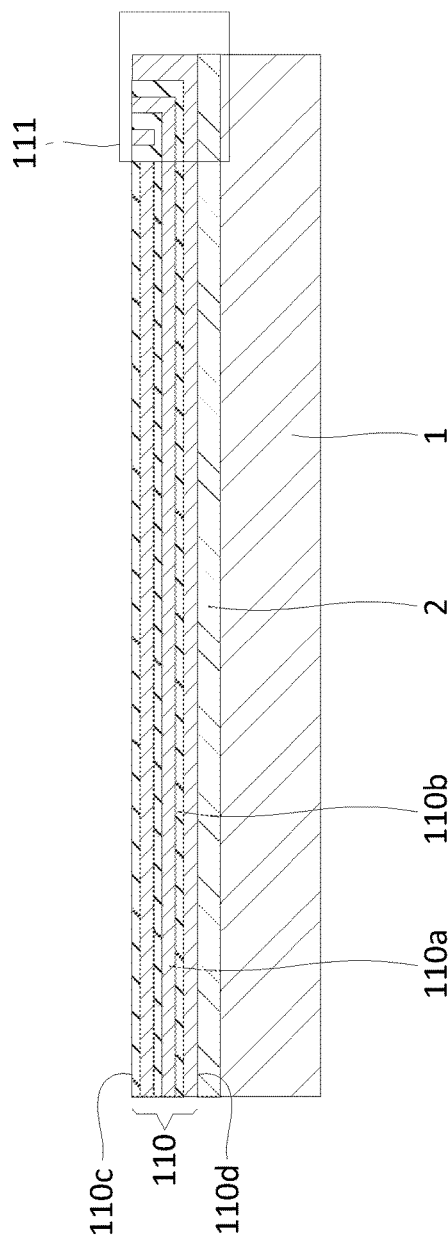
FIGS. 2A to 2D show cross-sectional views of an example method for manufacturing an example semiconductor device.

FIGS. 2A to 2D show cross-sectional views of an example method for manufacturing semiconductor device 100. FIG. 2A shows a cross-sectional view of semiconductor device 100 at an early stage of manufacture.

In the example shown in FIG. 2A, substrate 110 can comprise a top surface 110c and a bottom surface 110d opposite to top surface 110c, and bottom surface 110d of substrate 110 can be coupled to a surface of carrier 1. Although a single substrate 110 is shown, this is not a limitation of the present disclosure. In other examples, multiple substrates 110 can be arranged on carrier 1 to be spaced apart from one another in a row-wise or column-wise direction.

Substrate 110 can comprise dielectric structure 110a, conductive structure 110b, and substrate tab 111. Substrate tab 111 can comprise conductive structure 110b exposed at top surface 110c of substrate 110. Substrate tab 111 can be located at or near at least one side or one end of substrate 110. In addition, substrate tab 111 can be exposed to form an electrical connection path between semiconductor device 100 and an external component or another semiconductor device.

In some examples, substrate 110 can be a pre-formed substrate. The pre-formed substrate can be manufactured prior to attachment to electronic components or devices and can comprise dielectric layers between respective conductive layers. The conductive layers can comprise copper and can be formed or provided using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed or provided by using a drill or laser. In some examples, the dielectric layers can comprise a prepreg material or Ajinomoto Buildup Film (ABF). The pre-formed substrate can include a permanent core structure or carrier such as, for example, a dielectric material comprising bismaleimide triazine (BT), or FR4, and dielectric and conductive layers can be formed or provided on the permanent core structure. In some examples, the pre-formed substrate can be a coreless substrate and can omit the permanent core structure, and the dielectric and conductive layers can be formed or provided on a sacrificial carrier that is removed after formation of the dielectric and conductive layers and before attachment to the electronic device. The pre-formed substrate can rereferred to as a printed circuit board (PCB) or a laminate substrate. Such a pre-formed substrate can be formed or provided through a semi-additive or modified-semi-additive process.

In some examples, substrate 110 can be a redistribution layer ("RDL") substrate. RDL substrates can comprise one or more dielectric layers and one or more conductive redistribution layers that: (a) can be formed or provided layer by layer over electronic components to which the RDL substrate is to be electrically coupled; or (b) can be formed or provided layer by layer over a carrier that can be entirely removed or at least partially removed after the electronic components and the RDL substrate are coupled together. RDL substrates can be manufactured layer by layer as a wafer-level substrate on a round wafer in a wafer-level process, or as a panel-level substrate on a rectangular or square panel carrier in a panel-level process. RDL substrates can be formed or provided in an additive buildup process that can include one or more dielectric layers alternatingly stacked with one or more conductive layers that define respective conductive redistribution patterns or traces configured to collectively: (a) fan-out electrical traces outside the footprint of the electronic components; or (b) fan-in electrical traces within the footprint of the electronic components. The conductive patterns can be formed or provided using a plating process such as, for example, an electroplating process or an electroless plating process. The conductive patterns can comprise an electrically conductive material such as, for example, copper or other plateable metal. The locations of the conductive patterns can be made using a photo-patterning process such as, for example, a photolithography process and a photoresist material to form a photolithographic mask. The dielectric layers of the RDL substrate can be patterned with a photo-patterning process which can include a photolithographic mask through which light is exposed to photo-pattern desired features such as vias in the dielectric layers. Thus, the dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form rather than attached as a pre-formed film. To permit proper formation of desired photo-defined features, such photo-definable dielectric materials can omit structural reinforcers or can be filler-free, without strands, weaves, or other particles, that could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of one or more inorganic dielectric layers can comprise silicon nitride (Si3N4), silicon oxide (SiO2), or silicon oxynitride (SiON). The one or more inorganic dielectric layers can be formed or provided by growing the inorganic dielectric layers using an oxidation or nitridization process instead using photo-defined organic dielectric materials. Such inorganic dielectric layers can be filler-fee, without strands, weaves, or other dissimilar inorganic particles. In some examples, the RDL substrates can omit a permanent core structure or carrier such as, for example, a dielectric material comprising bismaleimide triazine (BT), or FR4 and these types of RDL substrates can be referred to as a coreless substrate.

In some examples, substrate 110 can comprise or be referred to as a pre-formed substrate, an RDL substrate, a printed circuit board (PCB), a cavity substrate, a printed wiring board, a multi-layered substrate, a through hole substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate, or a molded lead frame.

In some examples, dielectric structure 110a can have planar top and bottom surfaces. The top and bottom surfaces of dielectric structure 110a can be parallel with top surface 110c and bottom surface 110d of substrate 110. In some examples, dielectric structure 110a can be referred to as a dielectric layer or a core layer. Dielectric structure 110a can include one or more dielectric layers. In some examples, dielectric structure 110a can comprise epoxy resin, phenolic resin, glass epoxy, polyimide, polyester, an epoxy molding compound, ceramic, bismaleimide triazine (BT), or FR4. In some examples, dielectric structure 1106a can have a thickness ranging from approximately 0.1 millimeters (mm) to approximately 10 mm. Dielectric structure 110a can be used to prevent warpage or maintain planarity of substrate 110.

Conductive structure 110b can be coupled to dielectric structure 110a. In some examples, conductive structure 110b can be referred to as a conductor, a conductive material, a conductive via, a circuit pattern, a trace, or a wiring pattern. In some examples, a portion of conductive structure 110b can be exposed for electrical coupling to electronic components 121, 122, or 123 or external interconnects 150. In some examples, conductive structure 110b can be electrically coupled to electronic components 121, 122, or 123 or external interconnects 150 through a conductor, a conductive material, an electrically conductive via, a substrate land, a conductive land, a substrate pad, a wiring pad, a connection pad, a micro pad, or an under-bump-metallurgy (UBM). In some examples, conductive structure 110b can comprise copper, aluminum, iron, nickel, gold, silver, palladium, or tin.

In some examples, substrate tab 111 can be exposed at or near top surface 110c of substrate 110. Substrate tab 111 can comprise conductive structure 110b exposed at or near one side of substrate 110. In some examples, substrate tab 111 can comprise conductive structure 110b upwardly bent and exposed. In some examples, substrate tab 111 can provide an exposed electrical connection path.

In some examples, carrier 1 can comprise a planar structure. Carrier 1 can be referred to as a board, a wafer, a panel, a semiconductor carrier, or a strip. In some examples, carrier 1 can comprise steel, stainless steel, aluminum, copper, ceramic, glass, silicon, metal, alloy, or a semiconductor material. Carrier 1 can have a thickness in the range from approximately 1 mm to approximately 1.5 mm, and a width in the range from approximately 200 mm to approximately 510 mm.

In some examples, carrier 1 can support multiple components during the manufacture of semiconductor device 100. For example, carrier 1 can provide a base structure for supporting substrate 110, electronic components 121, 122, or 123 and dielectric 130. In some examples, electronic assembly 10 can comprise a base structure comprising a top surface, wherein semiconductor devices 100 and 200 can be over the top surface of the base structure.

In some examples, bond layer 2 can be formed or provided on a top surface of carrier 1. Examples for forming bond layer 2 can comprise using: a coating process, for example spin coating, blade, casting, painting, spray coating, slot die coating, curtain coating, slide coating, or knife over edge coating; a printing process, for example screen printing, pad printing, gravure printing, flexographic coating, or offset printing; an inkjet printing process with intermediate features of coating and printing; or direct attachment of an adhesive film or an adhesive tape. Substrate 110 can be formed or provided on bond layer 2.

Bond layer 2 can be referred to as a temporary adhesive film or a temporary adhesive tape. Bond layer 2 can comprise a thermal release tape or an ultraviolet (UV) release tape. In some examples, the bonding strength of bond layer 2 can be reduced by heat or UV radiation. In some examples, temporary bond layer 2 can be removed from substrate 110 or carrier 1 at a later stage of manufacture.

Figure 2B:
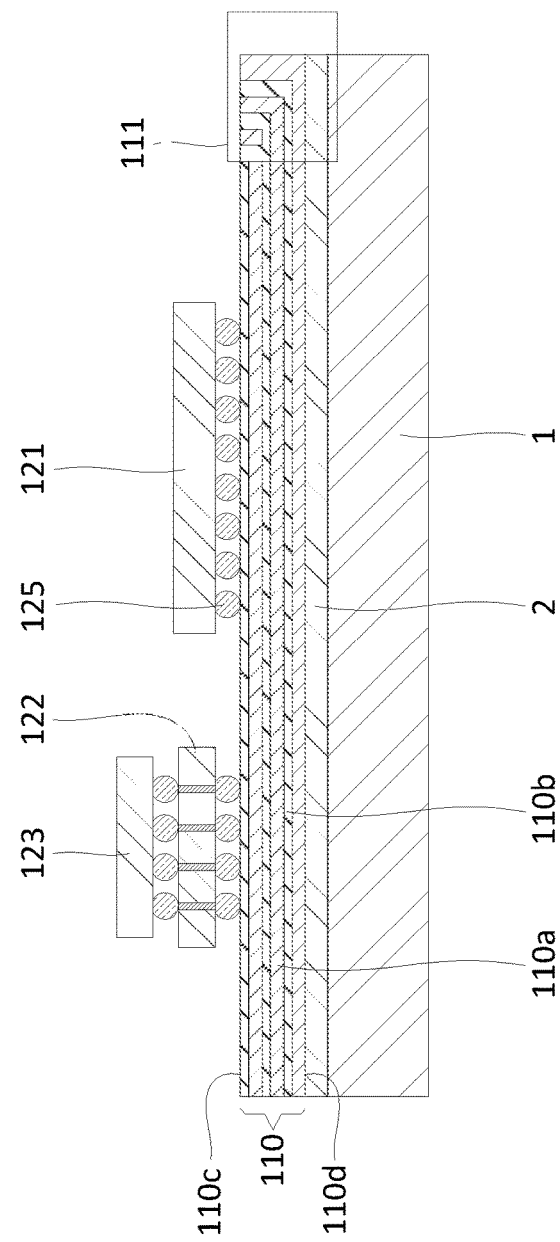

FIG. 2B shows a cross-sectional view of semiconductor device 100 at a later stage of manufacture. In the example shown in FIG. 2B, electronic components 121 and 122 can be provided on or over surface 110c of substrate 110 and electronic component 123 can be on electrical component 122. In some examples, electronic components 121, 122, or 123 can be electrically coupled to conductive structure 110b of substrate 110.

In some examples, pick-and-place equipment can pick up electronic components 121, 122, or 123, place electronic components 121 and 122 on substrate 110, and place component 123 on component 122. In some examples, a mass reflow, thermal compression, or laser assist bonding (LAB) process can be used to attach components 121, 122, or 123 to each other and substrate 110 or electrically couple substrate 110 to components 121, 122, or 123.

In some examples, electronic components 121, 122, or 123 can comprise a semiconductor die or a semiconductor chip. In some examples, electronic components 121, 122, or 123 can comprise a semiconductor material such as, for example, silicon (Si). Electronic components 121, 122, or 123 can comprise passive electronic circuit elements (not shown), or active electronic circuit elements (not shown) such as transistors. In some examples, electronic components 121, 122, or 123 can comprise an application specific integrated circuit, a logic die, a micro control unit, a memory, a digital signal processor, a network processor, a power management unit, an audio processor, a radio-frequency (RF) circuit, or a wireless baseband system on chip processor.

In some examples, electronic component 122 can comprise a through silicon via (TSV) interposer and can provide an electrically conductive path between electrical component 123 and substrate 110. Electronic components 121, 122, or 123 can each have a thickness in the range from approximately 50 μm to approximately 780 μm. Electronic components 121, 122, or 123 can each have a width in the range from approximately 3 mm to approximately 10 mm.

In some examples, electronic components 121, 122, or 123 can comprise a passive device. In some examples, electronic components 121, 122, or 123 can comprise a resistor, a capacitor, an inductor, or a connector. In addition, electronic components 121, 122, or 123 can be electrically coupled to conductive structure 110b of substrate 110.

In some examples, electronic components 121, 122, or 123 can comprise electrical interconnects such as, for example, interconnects 125. In some examples, interconnects 125 can electrically couple die terminals of electronic components 121, 122, or 123 to substrate 110. In some examples, interconnects 125 can comprise wafer bumps, pillar wafer bumps, copper pillar wafer bumps, copper pillar wafer bumps comprising a solder tip formed or provided on the external end of the copper pillar, copper stud bumps, gold stud bumps, or solder wafer bumps. In some examples, interconnects 125 can comprise tin (Sn), silver (Ag), lead (Pb), copper (Cu), aluminum, Sn—Pb, Sn37—Pb, Sn95—Pb, Sn—Pb—Ag, Sn—Cu, Sn—Ag, Sn—Au, Sn—Bi, or Sn—Ag—Cu.

Figure 2C:
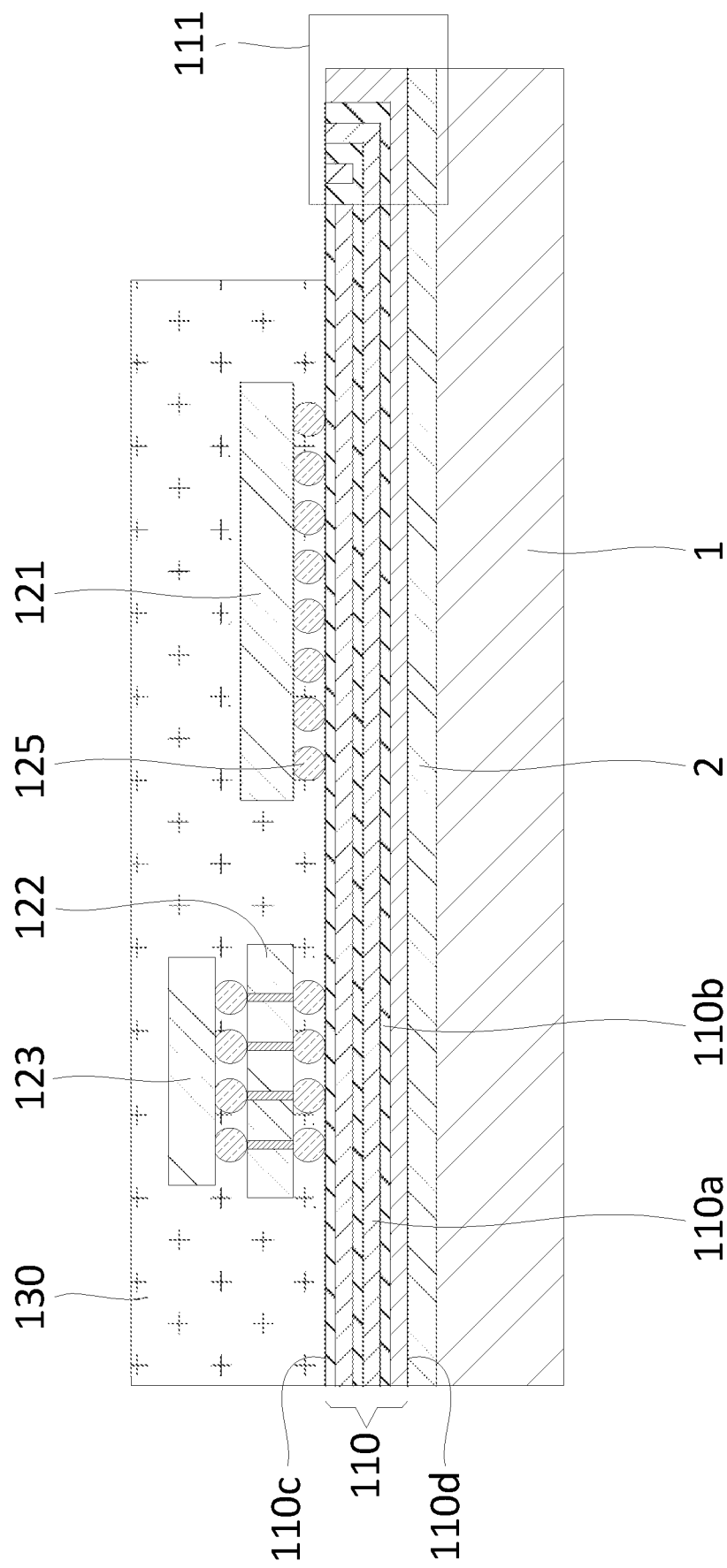

FIG. 2C shows a cross-sectional view of semiconductor device 100 at a later stage of manufacture. In the example shown in FIG. 2C, dielectric 130 can be formed or provided or provided on or over top surface 110c of substrate 110 and on components 121, 122, or 123. In some examples, dielectric 130 can contact top surface 110c of substrate 110 and the top, bottom, or side surfaces of components 121, 122, or 123 to encapsulate electronic components 121, 122, or 123. In some examples, dielectric 130 can be referred to as an encapsulant.

In some examples, encapsulant 130 can be formed or provided to expose substrate tab 111 wherein substrate tab 111 is not covered by encapsulant or dielectric material 130. In some examples, substrate tab 111 can be electrically coupled to an external circuit or another semiconductor device.

In some examples, encapsulant 130 can comprise an epoxy molding compound, an epoxy molding resin, or a sealant. In some examples, encapsulant 130 can be referred to as a molding part, a sealing part, an encapsulation part, a protection part, or a body. In some examples, encapsulant 130 can comprise an organic resin, an inorganic filler, a curing agent, a catalyst, a coupling agent, a colorant, or a flame retardant. In some examples, encapsulant 130 can be formed or provided or provided by compression molding, transfer molding, liquid-phase encapsulant molding, vacuum lamination, paste printing, or film assist molding. Encapsulant 130 can have a thickness in the range from approximately 0.1 mm to approximately 1 mm. Encapsulant 130 can protect substrate 110 and electronic components 121, 122, or 123 from external elements or environmental exposure. In some examples, substrate 110 can be provided on carrier 1 prior to providing electronic components 121, 122, or 123 over the top surface of substrate 110.

Figure 2D:
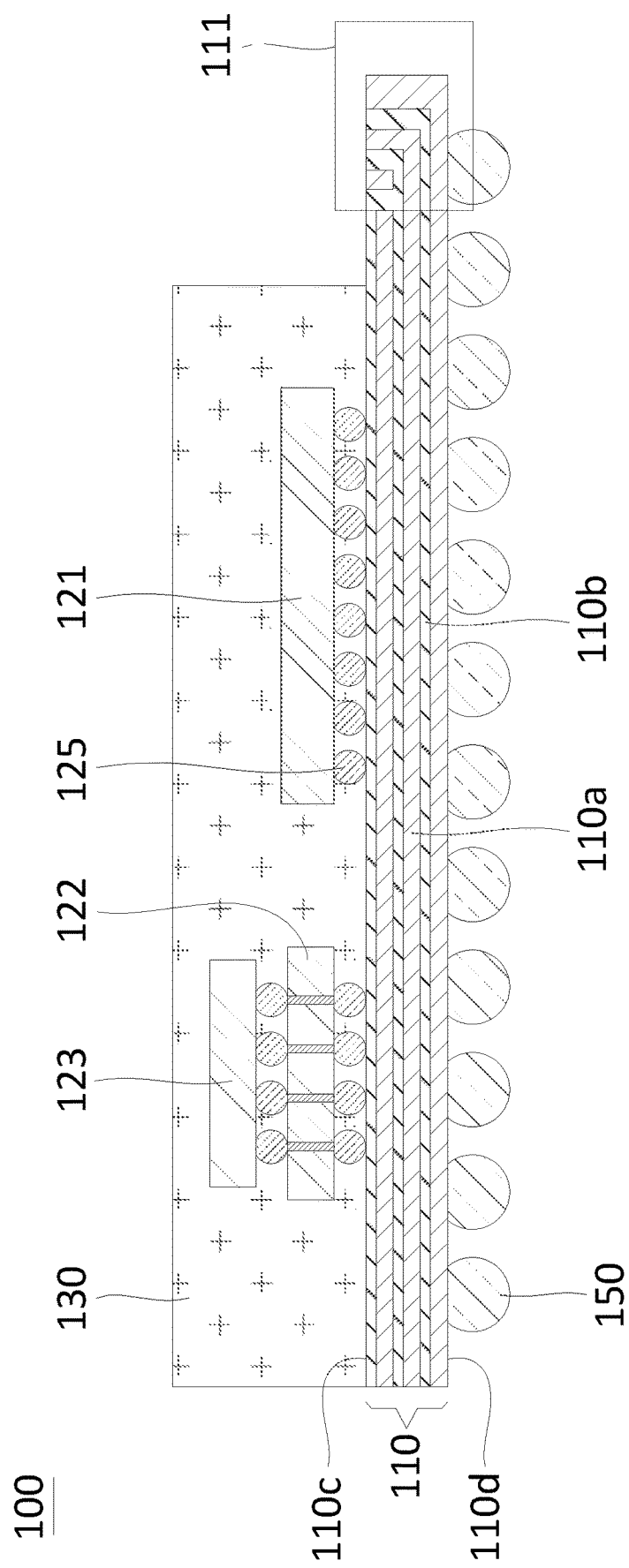

FIG. 2D shows a cross-sectional view of semiconductor device 100 at a later stage of manufacture. In the example shown in FIG. 2D, carrier 1 can be separated from the assembly shown in FIG. 2C. In some examples, carrier 1 can be removed by applying heat or UV light to the assembly shown in FIG. 2C to reduce the bonding strength of bond layer 2. In some examples, bond layer 2 and carrier 1 can be removed by applying a physical force to pull bond layer 2 and carrier 1 from substrate 110. In other examples, a grinding process can be used to remove bond layer 2 and carrier 1. In some examples, carrier 1 can be removed after providing dielectric or encapsulant 130 on the top surface substrate 110.

In addition, external interconnects 150 can be coupled to bottom surface 110d of substrate 110. In some examples, external interconnects 150 can comprise an electrically conductive material. In some examples, external interconnects 150 can comprise tin (Sn), silver (Ag), lead (Pb), copper (Cu), aluminum, gold, Sn—Pb, Sn37—Pb, Sn95—Pb, Sn—Pb—Ag, Sn—Cu, Sn—Ag, Sn—Au, Sn—Bi, or Sn—Ag—Cu. In some examples, external interconnects 150 can be formed or provided or provided by a solder ball drop process, screen printing, or electroplating. Examples for manufacturing interconnects 150 can comprise forming a conductive material comprising solder on bottom surface 110d of substrate 110 using a solder ball drop process, followed by performing a solder reflow process to apply heat to semiconductor device 100. In some examples, external interconnects 150 can be referred to as conductive balls, solder balls, conductive pillars, or copper pillars. In some examples, interconnects 150 can comprise copper pillars comprising solder caps on an end region of the copper pillars. External interconnects 150 can have a width in a range from approximately 0.1 mm to approximately 0.5 mm. In some examples, external interconnects 150 can be referred to as external input/output (I/O) terminals of semiconductor device 100.

Figure 3C:
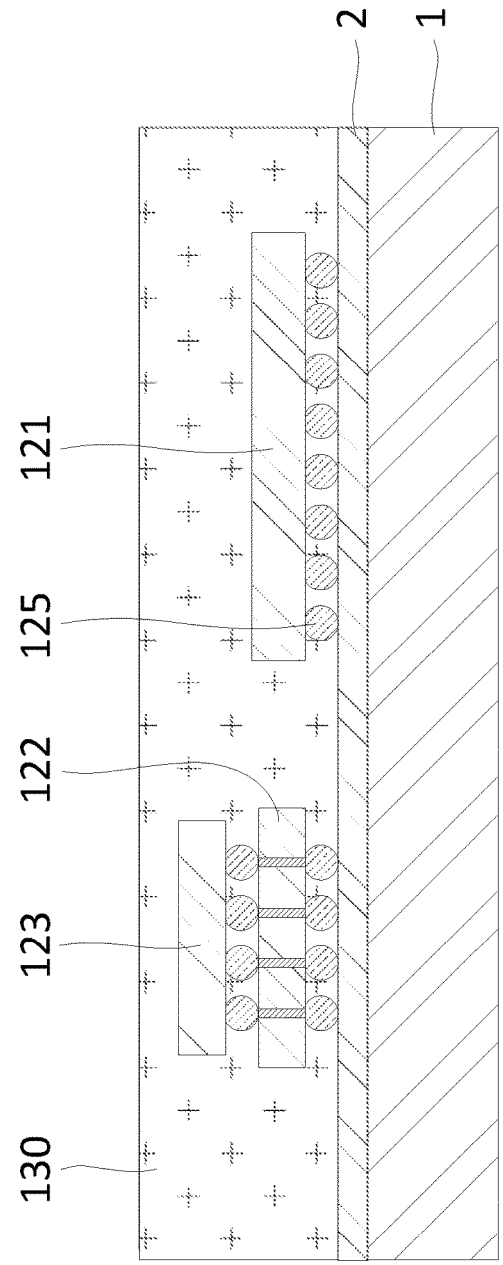

FIGS. 3A to 3F show cross-sectional views of an example method for manufacturing semiconductor device 100. FIG. 3A shows a cross-sectional view of semiconductor device 100 at an early stage of manufacture. In the example shown in FIG. 3A, carrier 1 can comprise a planar structure and can support multiple components during the manufacture of semiconductor device 100.

FIG. 3B shows a cross-sectional view of semiconductor device 100 at a later stage of manufacture. In the example shown in FIG. 3B, bond layer 2 is formed or provided or provided on carrier 1. In some examples, electronic components 121 and 122 can be on bond layer 2 and electronic component 123 can be on electrical component 122.

FIG. 3C shows a cross-sectional view of semiconductor device 100 at a later stage of manufacture. In the example shown in FIG. 3C, dielectric 130 can be formed or provided on the top surface of bond layer 2 and on components 121, 122, or 123. In some examples, dielectric 130 can contact the top surface of bond layer 2 and the top, bottom, and side surfaces of components 121, 122, or 123 to encapsulate electronic components 121, 122, or 123. In some examples, dielectric 130 can be referred to as an encapsulant.

Figure 3D:
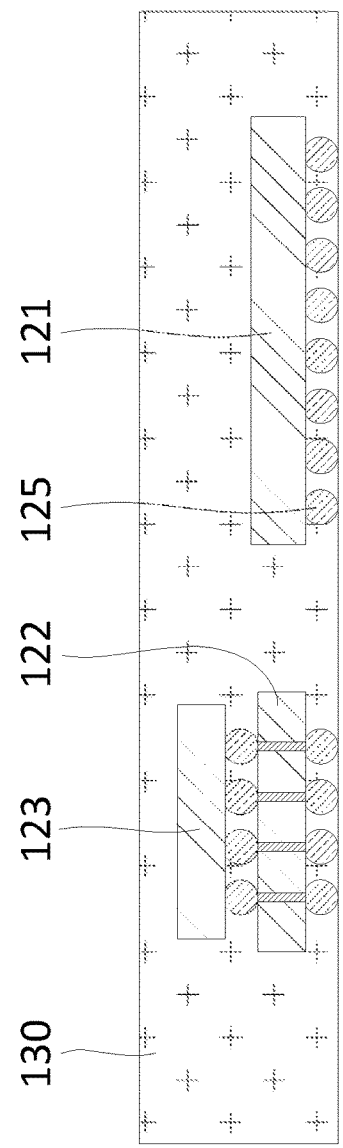

FIG. 3D shows a cross-sectional view of semiconductor device 100 at a later stage of manufacture. In the example shown in FIG. 3D, carrier 1 can be separated from the assembly shown in FIG. 3C. In some examples, carrier 1 can be removed by applying heat or UV light to the assembly shown in FIG. 3C to reduce the bonding strength of bond layer 2. In some examples, bond layer 2 and carrier 1 can be removed by applying a physical force to pull bond layer 2 and carrier 1. In some examples, encapsulant 130 and lower portions of interconnects 125 can be exposed after removal of bond layer 2 and carrier 1.

Figure 3E:
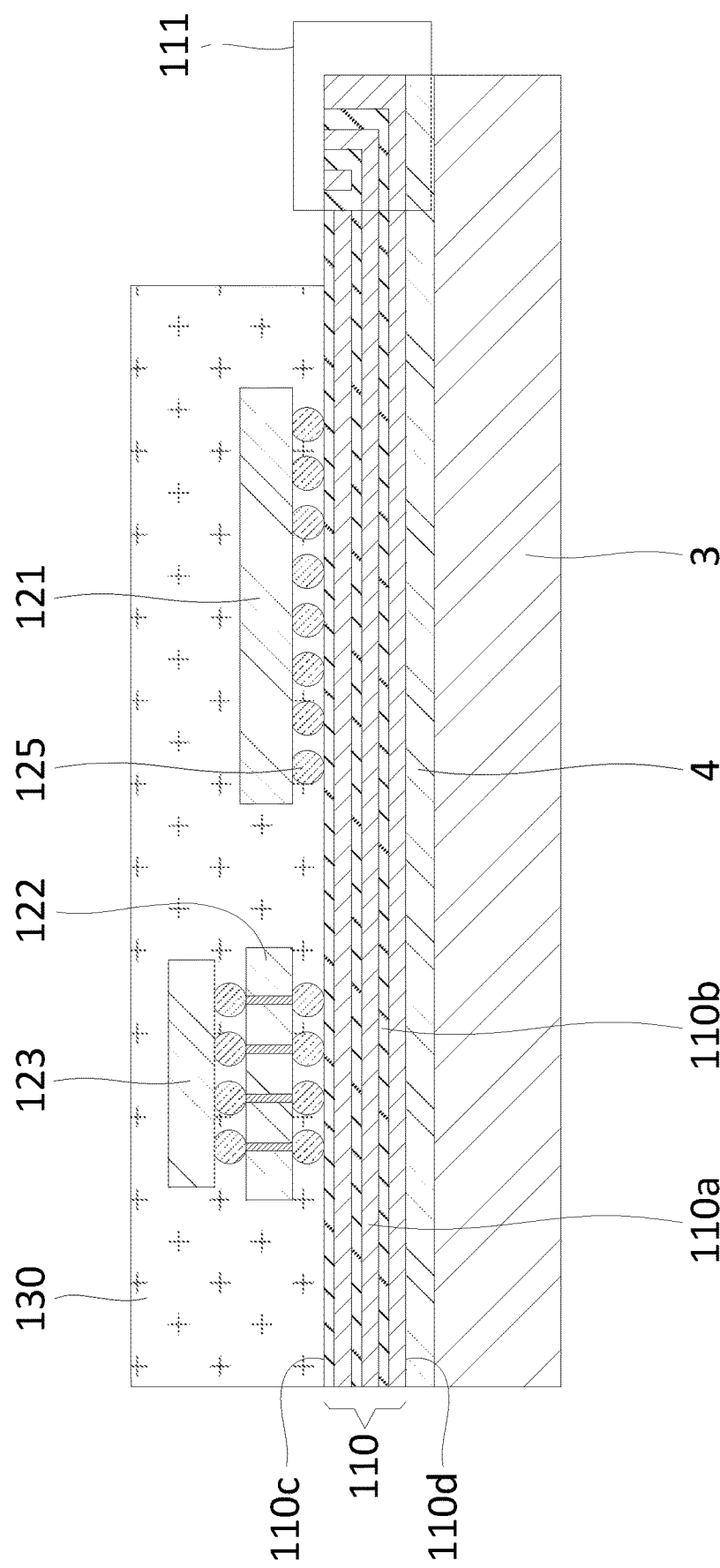

FIG. 3E shows a cross-sectional view of semiconductor device 100 at a later stage of manufacture. In the example shown in FIG. 3E, a bond layer 4 can be formed or provided on a carrier 3. In some examples, the manufacturing processes used to form, and the configuration of, bond layer 4 and carrier 3 can be the same or similar to those of bond layer 2 and carrier 1 discussed with reference to FIG. 1 and FIGS. 2A to 2D. In some examples, substrate 110 can be coupled to bond layer 4 after bond layer 4 is coupled to carrier 3.

In some examples, the assembly shown in FIG. 3D can be coupled to substrate 110 after substrate 110 is coupled to bond layer 4. In some examples, the bottom surface of encapsulant 130 and lower portions of interconnects 125 can be coupled to the top surface 110c of substrate 110.

Figure 3F:
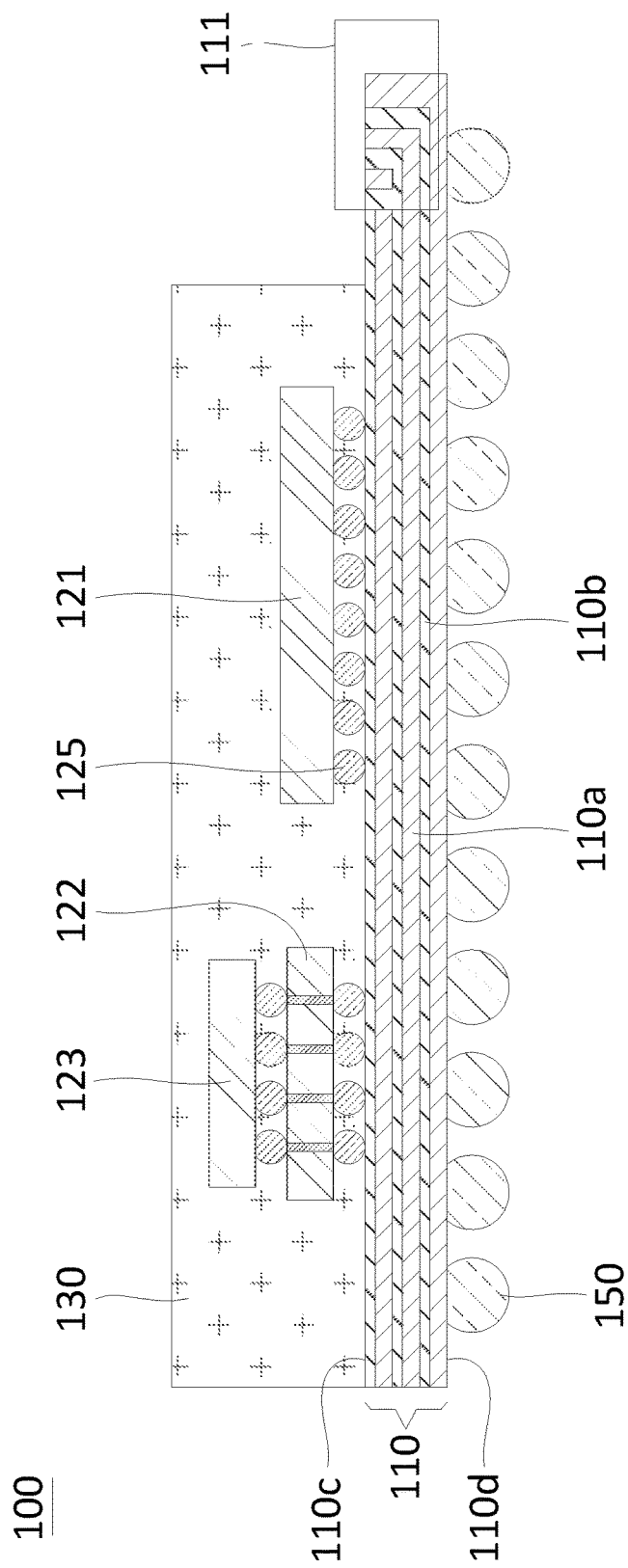

FIG. 3F shows a cross-sectional view of semiconductor device 100 at a later stage of manufacture. In the example shown in FIG. 3F, carrier 3 can be separated from the assembly shown in FIG. 3E. In some examples, carrier 3 can be removed by applying heat or UV light to the assembly shown in FIG. 3E to reduce the bonding strength of bond layer 4. In some examples, bond layer 4 and carrier 3 can be removed by applying a physical force to pull bond layer 4 and carrier 3 from substrate 110. In other examples, a grinding process can be used to remove bond layer 4 and carrier 3. In some examples, external interconnects 150 can be coupled to bottom surface 110d of substrate 110 after removal of bond layer 4 and carrier 3.

Figure 4:
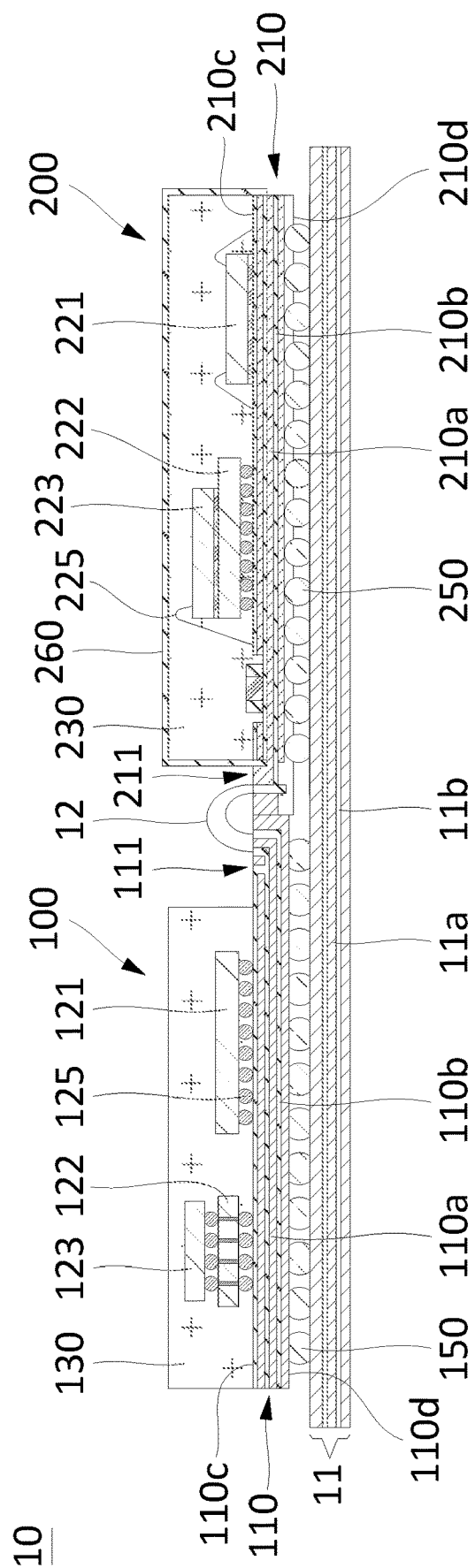
FIG. 4 shows a cross-sectional view of an example electronic assembly.
Figure 6:
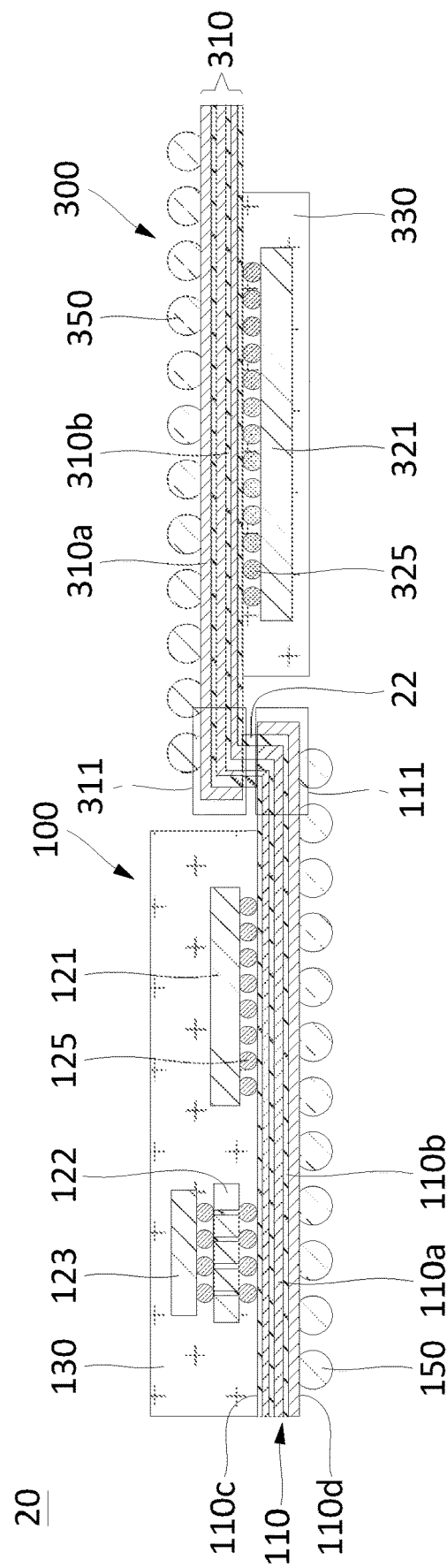
FIG. 6 shows a cross-sectional view of an example electronic assembly.
Figure 8:
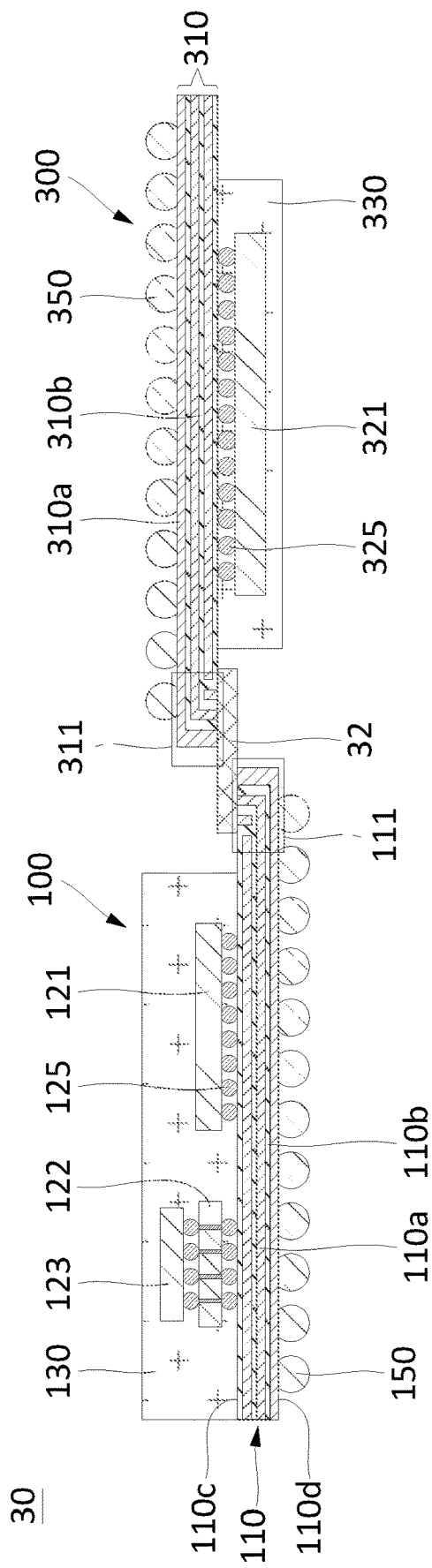
FIG. 8 shows a cross-sectional view of an example electronic assembly.

FIG. 4 shows a cross-sectional view of an example electronic assembly 10. In the example shown in FIG. 4, electronic assembly 10 can comprise base structure 11, electrical interconnect 12 such as a wire bond or clip, and semiconductor devices 100 and 200. In some examples, base structure 11 can comprise a dielectric structure 11a and a conductive structure 11b. In some examples, electronic assembly 10 can comprise semiconductor device 100 and semiconductor device 200 electrically coupled to each other, wherein each of semiconductor device 100 and semiconductor device 200 can comprise, for example, semiconductor device 100 as shown in and described with respect to FIG. 1. In some examples, electronic assembly 10 can comprise a base structure 11 comprising a top surface, wherein semiconductor devices 100 and 200 can be over the top surface of the base structure 11. In some examples, semiconductor devices 100 and 200 can be electrically coupled to each other via an electrical interconnect coupled to the substrate tabs 111 of the semiconductor devices, for example via electrical interconnect 12 as shown in FIG. 4, via electrical interconnect 22 as shown in FIG. 6, or via electrical interconnect 32 as shown in FIG. 8, and the scope of the disclosed subject matter is not limited in these respects.

In some examples, semiconductor device 200 can comprise substrate 210, electronic components 221, 222, or 223, electrical interconnect 225, encapsulant 230, external interconnects 250, and a cover layer 260. In some examples, substrate 210 can comprise a top surface 210c, a bottom surface 210d, a dielectric structure 210a, a conductive structure 210b, and a substrate tab 211. In some examples, electrical interconnect 225 can be referred to as a wire bond, and electrical interconnect 225 can comprise an electrically conductive material such as, for example, an alloy, gold, silver, copper, or palladium coated copper (PCC). In some examples, a die terminal of component 223 can be electrically coupled to conductive structure 210b of substrate 210 using electrical interconnect 225.

In some examples, substrate 210, encapsulant 230, and external interconnects 250 can be referred to as a semiconductor package and can protect electronic components 221, 222, or 223 from external elements or environmental exposure. The semiconductor package can provide electrical coupling between external components and electronic components 221, 222, or 223. In some examples, the manufacturing processes used to form, and the configuration of, semiconductor device 200 can be the same or similar to the manufacturing processes used to form, and the configuration of, semiconductor device 100 described in the present disclosure with reference to FIG. 1, FIGS. 2A to 2D, and FIGS. 3A to 3F. In some examples, semiconductor device 200 can be coupled to semiconductor device 100 by coupling substrate tab 211 to substrate tab 111.

In some examples, semiconductor device 200 can comprise cover layer 260 on an exterior surface of encapsulant 230. In some examples, cover layer 260 can be referred to as a conformal shield. In some examples, encapsulant can comprise four side surfaces, and cover layer 260 can comprise an electrically conductive material and can be located on the top surface and four side surfaces of encapsulant 230. In some examples, layer 260 can provide electromagnetic interference (EMI) shielding for electronic components 221, 222, or 223. In some examples, cover layer 260 can be electrically coupled to ground through conductive structure 211b of substrate 210 to provide EMI shielding.

Figure 5C:
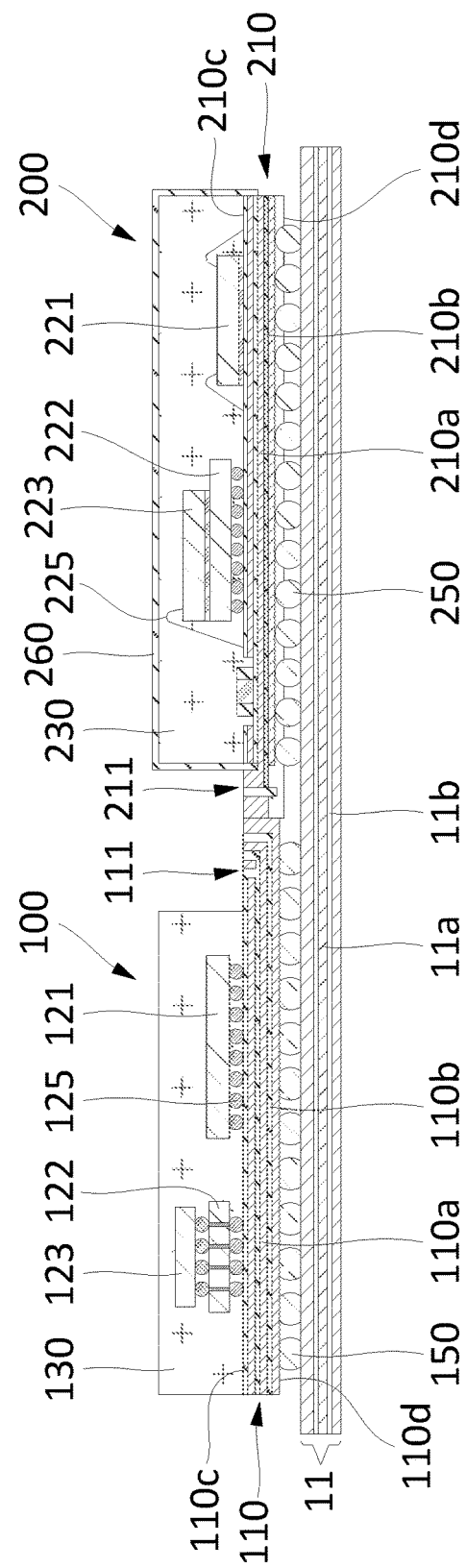

FIGS. 5A to 5D show cross-sectional views of an example method for manufacturing electronic assembly 10. FIG. 5A shows a cross-sectional view of electronic assembly 10 at an early stage of manufacture.

In the example shown in FIG. 5A, base structure 11 can comprise dielectric structure 11a and conductive structure 11b. In some examples, base structure 11 can comprise or be referred to as pre-formed substrate, an RDL substrate, a printed circuit board, a cavity substrate, a printed wiring board, a multi-layered substrate, a through hole substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate, or a molded lead frame.

In some examples, dielectric structure 11a can have planar top and bottom surfaces. The top and bottom surfaces of dielectric structure 11a can be parallel with the top and bottom surfaces of base structure 11. In some examples, dielectric structure 11a can be referred to as a dielectric layer or a core layer. Dielectric structure 11a can include one or more dielectric layers. In some examples, dielectric structure 11a can comprise epoxy resin, phenolic resin, glass epoxy, polyimide, polyester, an epoxy molding compound, ceramic, bismaleimide triazine (BT), or FR4.

Conductive structure 11b can be coupled to dielectric structure 11a. In some examples, conductive structure 11b can be referred to as a conductor, a conductive material, a conductive via, a circuit pattern, a trace, or a wiring pattern.

FIG. 5B shows a cross-sectional view of electronic assembly 10 at a later stage of manufacture. In the example shown in FIG. 5B, semiconductor device 100 can be on a portion of the top surface of base structure 11. Semiconductor device 100 can be electrically coupled to conductive structure 11b. In some examples, a mass reflow process, a thermal compression process, or a laser assist bonding process can be used to attach interconnects 150 to base structure 11 or to electrically couple interconnects 150 to conductive structure 11b of base structure 11.

FIG. 5C shows a cross-sectional view of electronic assembly 10 at a later stage of manufacture. In the example shown in FIG. 5C, semiconductor device 200 can be on a portion of the top surface of base structure 11. In some examples, substrate tab 211 of semiconductor device 200 can be adjacent to substrate tab 111 of semiconductor device 100. In some examples, substrate tab 111 can contact substrate tab 211. In other examples, substrate tab 111 can be spaced apart from substrate tab 211.

In some examples, conductive structure 11b of base structure 11 can be electrically coupled to semiconductor devices 100 or 200 through a conductor, a conductive material, an electrically conductive via, a substrate land, a conductive land, a substrate pad, a wiring pad, a connection pad, a micro pad, or an under-bump-metallurgy (UBM). In some examples, conductive structure 11b can comprise copper, aluminum, iron, nickel, gold, silver, palladium, or tin.

Figure 5D:
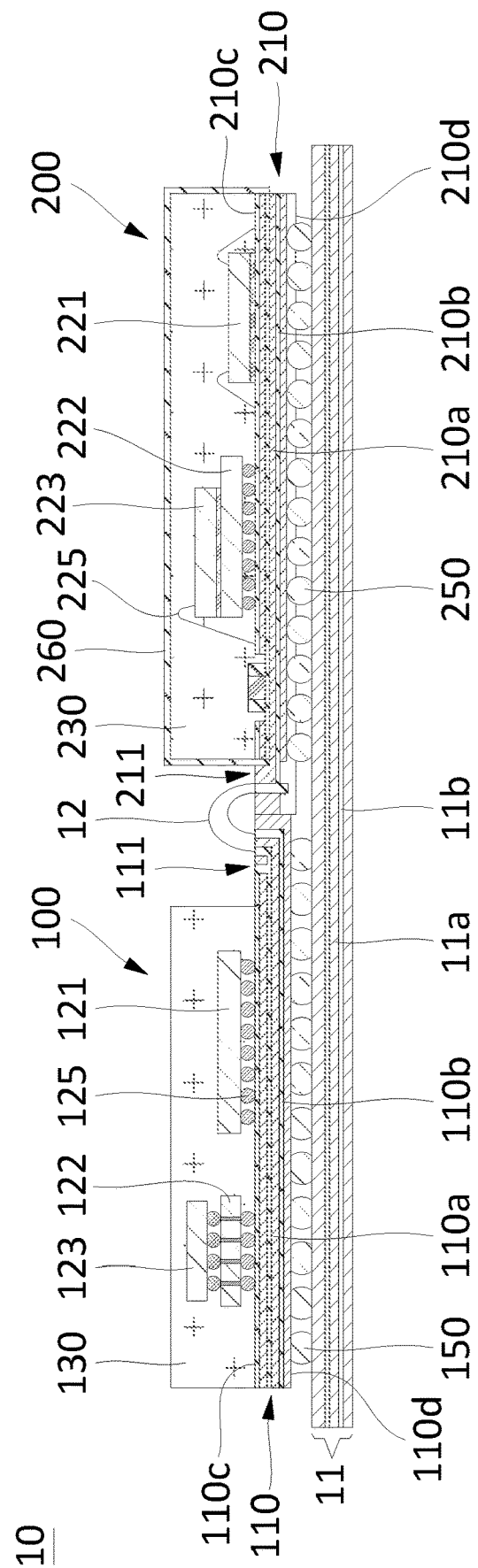

FIG. 5D shows a cross-sectional view of electronic assembly 10 at a later stage of manufacture. In the example shown in FIG. 5D, electrical interconnect 12 can be coupled to substrate tabs 111 and 211. In some examples, interconnect 12 can comprise an electrically conductive wire bond or clip, or multiple wire bonds and clips. In some examples, interconnect 12 can comprise an electrically conductive material such as, for example, an alloy, gold, silver, copper, or palladium coated copper (PCC). In some examples, conductive structure 110b of substrate 110 can be electrically coupled to conductive structure 210b of substrate 210 through interconnect 12. In some examples, interconnect 12 can provide an electrically conductive path between semiconductor devices 100 and 200. Interconnect 12 of electronic assembly 10 can provide relatively lower thermal resistance and relatively higher performance due to a relatively shorter electrical path compared to other electronic assemblies.

FIG. 6 shows a cross-sectional view of an electronic assembly 20. In the example shown in FIG. 6, electronic assembly 20 can comprise electrical interconnect 22 and semiconductor devices 100 and 300.

In some examples, semiconductor device 300 can comprise substrate 310, electronic component 321, interconnects 325, encapsulant 330, and external interconnects 350. Substrate 310 can comprise dielectric structure 310a, conductive structure 310b, and substrate tab 311. In the example shown in FIG. 6, semiconductor device 300 can be inverted with respect to semiconductor device 100 to allow the substrate tab 311 of semiconductor device 300 to be over substrate tab 111 of semiconductor device 100 to facilitate coupling of semiconductor devices 100 and 300. In some examples, any of the interconnects described herein including electrical interconnect 12, electrical interconnect 22, or interconnect 32 can comprise an interconnect substrate comprising a conductive material and any suitable substrate material, dielectric material, rigid material, or flexible material to form a substrate. In some examples, any of the interconnects described herein can comprise a lead frame. In some examples, when semiconductor device 300 is inverted with respect to semiconductor device 100 as shown in the configuration of FIG. 6, external interconnects 350 can be the same height as or can extend above or otherwise be higher than a top surface of encapsulant 130. Likewise, in such an inverted configuration, external interconnects 150 can be the same height as or extend below or otherwise be lower than a top surface of encapsulant 330.

In some examples, substrate 310, encapsulant 330 and external interconnects 350 can be referred to as a semiconductor package and can protect electronic component 321 from external elements or environmental exposure. The semiconductor package can provide electrical coupling between external components and electronic component 321. In some examples, substrate 310 can comprise or be referred to as pre-formed substrate, an RDL substrate, a printed circuit board, a cavity substrate, a printed wiring board, a multi-layered substrate, a through hole substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate, or a molded lead frame. In some examples, the manufacturing processes used to form, and the configuration of, semiconductor device 300 can be the same or similar to the manufacturing processes used to form, and the configuration of, semiconductor device 100 described in the present disclosure with reference to FIG. 1, FIGS. 2A to 2D, and FIGS. 3A to 3F. In some examples, semiconductor device 300 can be coupled to semiconductor device 100 by coupling substrate tab 311 to substrate tab 111.

Figure 7A:
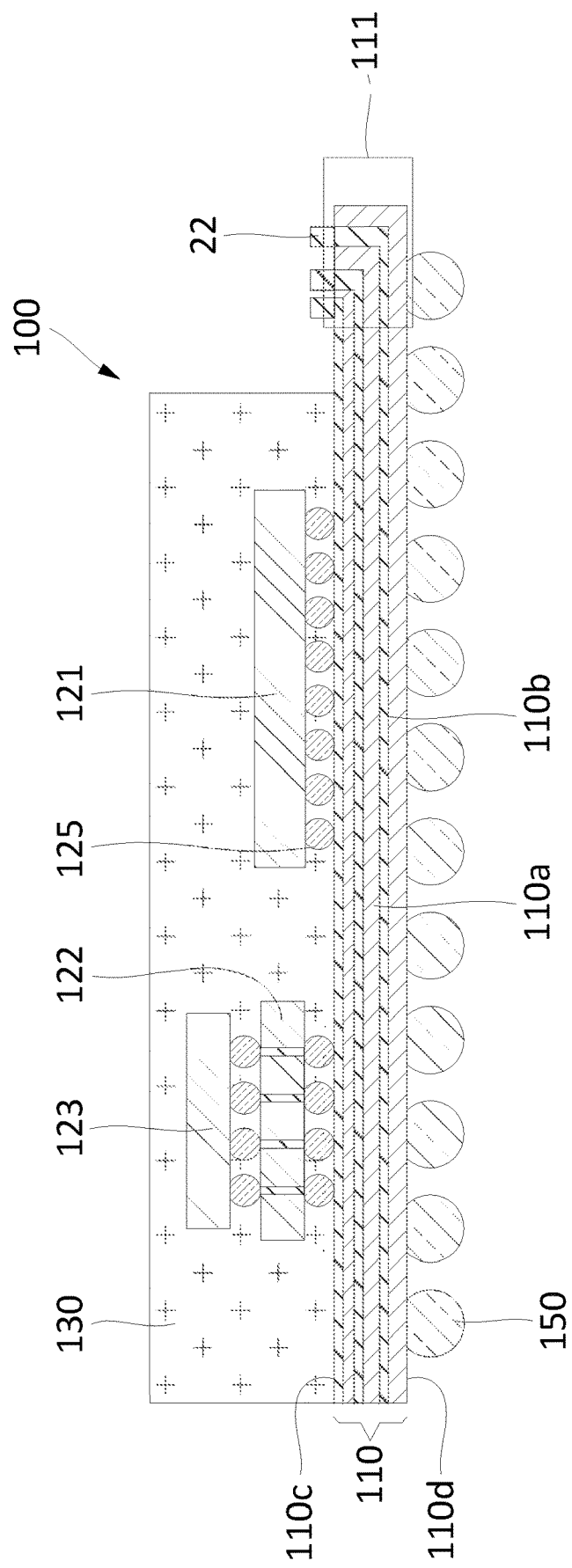
FIGS. 7A and 7B show cross-sectional views of an example method for manufacturing an example electronic assembly.
Figure 7B:
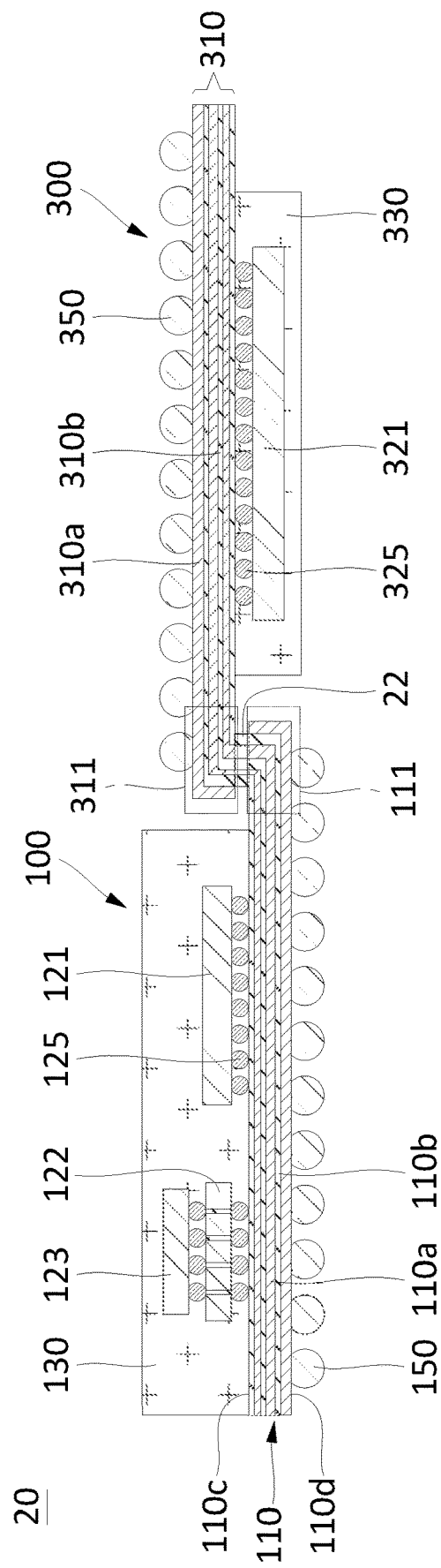

FIGS. 7A and 7B show cross-sectional views of an example method for manufacturing electronic assembly 20. FIG. 7A shows a cross-sectional view of electronic assembly 20 at an early stage of manufacture.

In the example shown in FIG. 7A, interconnect 22 can be located on substrate tab 111 of semiconductor device 100. In some examples, interconnect 22 can comprise an electrically conductive material such as, for example, solder or a copper pillar. In some examples, interconnect 22 can be electrically coupled to conductive structure 110b. In some examples, interconnect 22 can comprise tin (Sn), silver (Ag), lead (Pb), copper (Cu), gold, aluminum, Sn—Pb, Sn37—Pb, Sn95—Pb, Sn—Pb—Ag, Sn—Cu, Sn—Ag, Sn—Au, Sn—Bi, or Sn—Ag—Cu. In some examples, interconnect 22 can be formed or provided by a solder ball drop process, screen printing, or electroplating. In some examples, interconnects 22 can comprise copper pillars comprising solder caps on an end region of the copper pillars.

FIG. 7B shows a cross-sectional view of electronic assembly 20 at a later stage of manufacture. In the example shown in FIG. 7B, semiconductor device 300 can be coupled to semiconductor device 100. In some examples, substrate tab 311 of semiconductor device 300 can be coupled to interconnect 22, and substrate tabs 111 and 311 can be electrically and mechanically coupled to each other through interconnect 22. In some examples, substrate tab 311 is over substrate tab 111, and substrate tabs 111 and 311 can provide an electrical path between semiconductor devices 100 and 300. In some examples, a mass reflow process, a thermal compression process, or a laser assist bonding process can be used to attach tab 311 to interconnect 22 or to electrically couple components of device 100 to components of device 300. Interconnect 22 of electronic assembly 20 can provide relatively lower thermal resistance and relatively higher performance due to a relatively shorter electrical path compared to other electronic assemblies.

FIG. 8 shows a cross-sectional view of an example electronic assembly 30. In the example shown in FIG. 8, electronic assembly 30 can comprise an interconnect 32 and semiconductor devices 100 and 300.

Figure 9A:
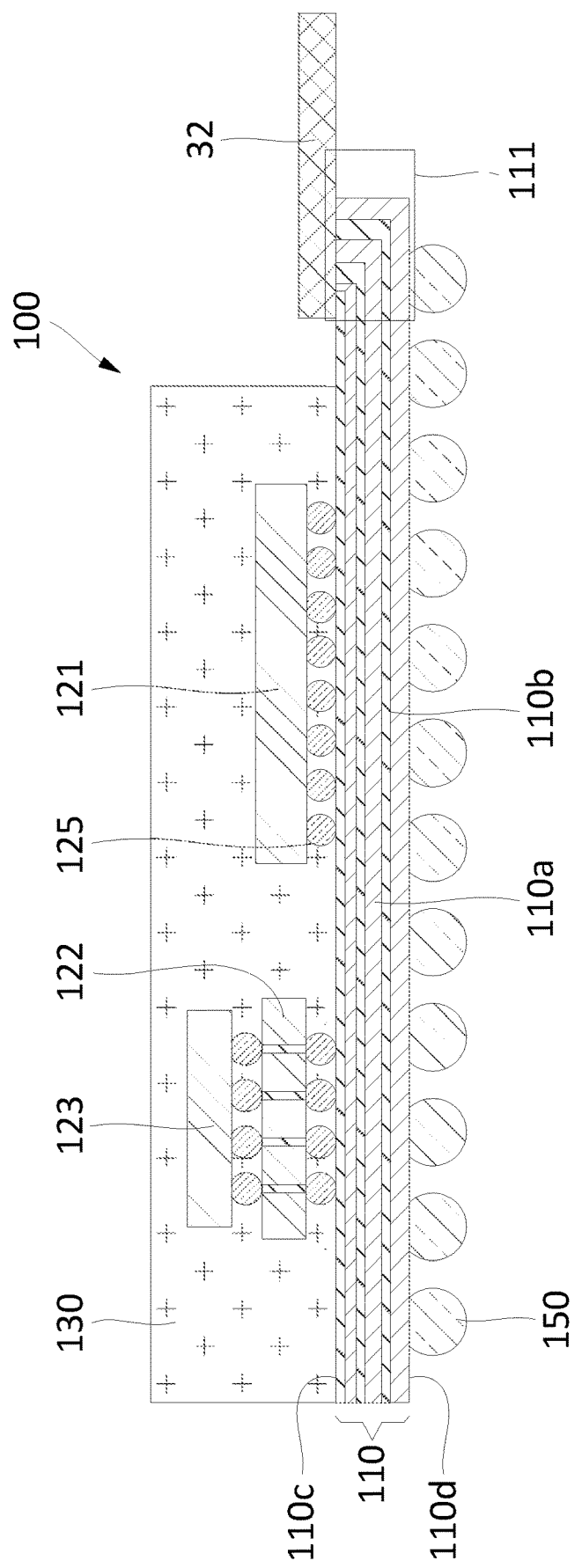
FIGS. 9A to 9C show cross-sectional views of an example method for manufacturing an example electronic assembly.
Figure 9B:
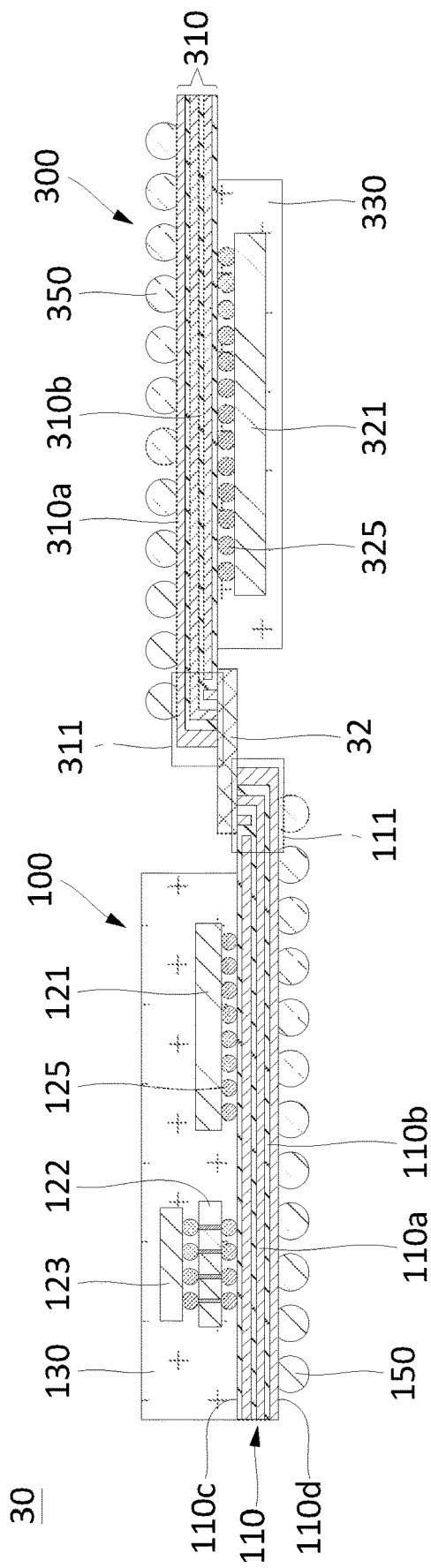
Figure 9C:
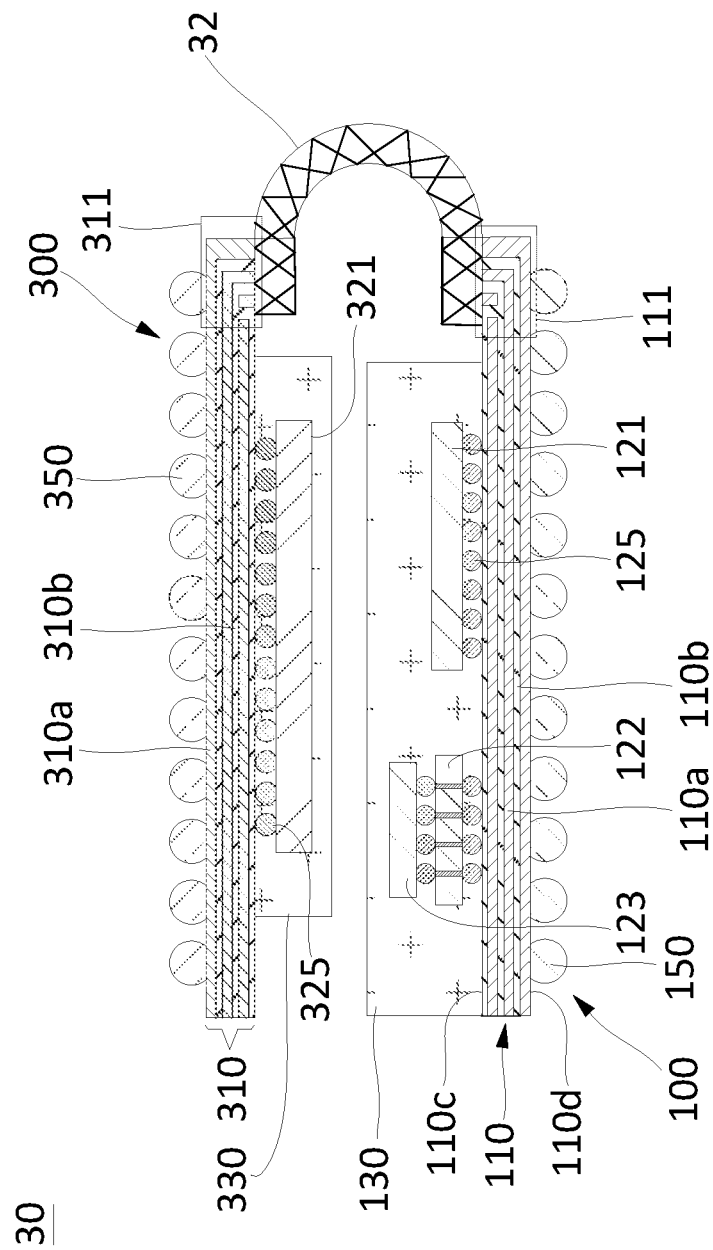

FIGS. 9A to 9C show cross-sectional views of an example method for manufacturing electronic assembly 30. FIG. 9A shows a cross-sectional view of electronic assembly 30 at an early stage of manufacture.

In the example shown in FIG. 9A, interconnect 32 can be on substrate tab 111 of semiconductor device 100. In some examples, interconnect 32 can comprise or be referred to as a pre-formed substrate, an RDL substrate, a printed circuit board, a cavity substrate, a printed wiring board, a multi-layered substrate, a through hole substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate, or a molded lead frame. In some examples, interconnect 32 can have a top surface and a bottom surface and can comprise a conductive pattern on its bottom surface. In some examples, a mass reflow process, a thermal compression process, or a laser assist bonding process can be used to attach interconnect 32 to substrate tab 111 of semiconductor device 100 or to electrically couple components of device 100 to the conductive pattern of interconnect 32.

FIG. 9B shows a cross-sectional view of electronic assembly 30 at a later stage of manufacture. In the example shown in FIG. 9B, semiconductor device 300 can be coupled to semiconductor device 100. In some examples, substrate tab 311 of semiconductor device 300 can be coupled to the top surface of interconnect 32 after interconnect 32 is coupled to substrate tab 111, and substrate tabs 111 and 311 can be electrically and mechanically coupled to each other through interconnect 32. In some examples, tab 111 contacts a first portion of interconnect 32 and tab 311 contacts a second portion of interconnect 32. In some examples, tab 111 contacts a bottom surface of interconnect 32 and tab 311 contacts a top surface of interconnect 32. In some examples, interconnect 32 and substrate tabs 111 and 311 can provide an electrical path between semiconductor devices 100 and 300. In some examples, a mass reflow process, a thermal compression process, or a laser assist bonding process can be used to attach tab 311 to interconnect 32 or to electrically couple components of device 100 to components of device 300. Interconnect 32 of electronic assembly 30 can provide relatively lower thermal resistance and relatively higher performance due to a relatively shorter electrical path compared to other electronic assemblies.

FIG. 9C shows a cross-sectional view of electronic assembly 30 at a later stage of manufacture. In the example shown in FIG. 9C, semiconductor device 300 can be coupled to semiconductor device 100 as shown FIG. 9B, except that interconnect 32 is shown as being flexed such that semiconductor device 300 and semiconductor device can be in a fold-over arrangement. In such a fold-over arrangement, the flexibility of interconnect 32 can allow semiconductor device 300 to be folded over a top side of semiconductor device 100, or vice-versa, and can allow semiconductor device 300 and semiconductor device 100 to be provided in a stacked package arrangement. In the example shown in FIG. 9C, semiconductor device 300 is shown as being inverted with respect to the orientation of semiconductor device 100. In other examples, semiconductor device 300 is not inverted with respect to the orientation of semiconductor device 100, and the scope of the disclosed subject matter is not limited in this respect.

Figure 10:
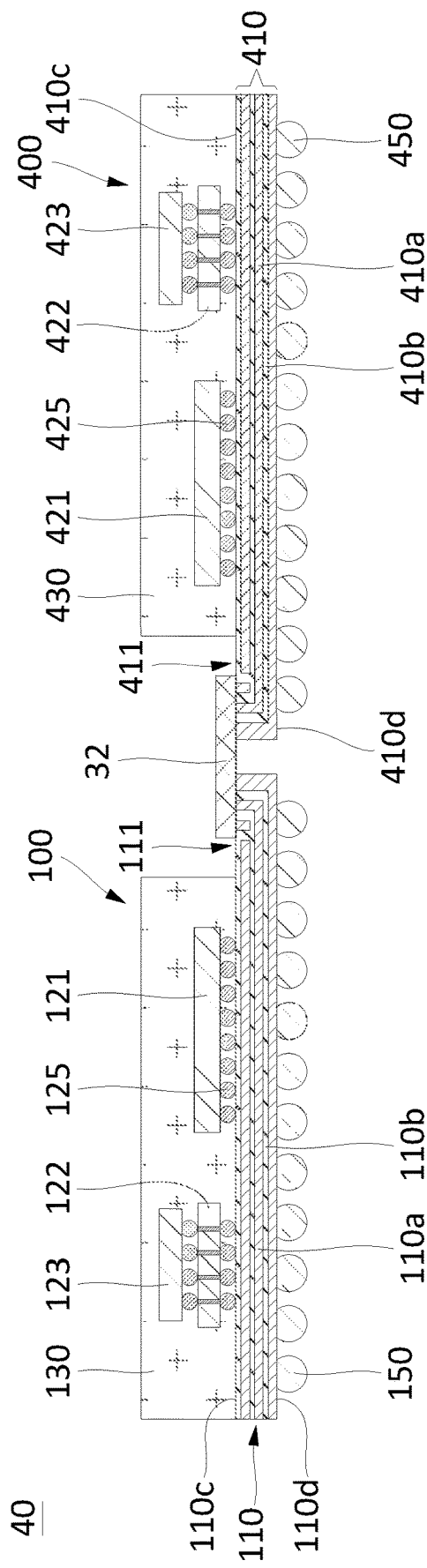
FIG. 10 shows a cross-sectional view of an example electronic assembly.

FIG. 10 shows a cross-sectional view of an electronic assembly 40. In the example shown in FIG. 10, electronic assembly 40 can comprise electrical interconnect 32 and semiconductor devices 100 and 400.

In some examples, semiconductor device 400 can comprise substrate 410, electronic components 421, 422, or 423, interconnects 425, encapsulant 430, and external interconnects 450. Substrate 410 can comprise dielectric structure 410a, conductive structure 410b, and substrate tab 411.

In some examples, substrate 410, encapsulant 430, and external interconnects 450 can be referred to as a semiconductor package and can protect electronic components 421, 422, or 423 from external elements or environmental exposure. The semiconductor package can provide electrical coupling between external components and electronic components 421, 422, or 423. In some examples, substrate 410 can comprise or be referred to as pre-formed substrate, an RDL substrate, a printed circuit board, a cavity substrate, a printed wiring board, a multi-layered substrate, a through hole substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate, or a molded lead frame. In some examples, the manufacturing processes used to form, and the configuration of, semiconductor device 400 can be the same or similar to the manufacturing processes used to form, and the configuration of, semiconductor device 100 described in the present disclosure with reference to FIG. 1, FIGS. 2A to 2D, and FIGS. 3A to 3F. In some examples, semiconductor device 400 can be coupled to semiconductor device 100 by coupling substrate tab 411 to substrate tab 111.

Figure 11A:
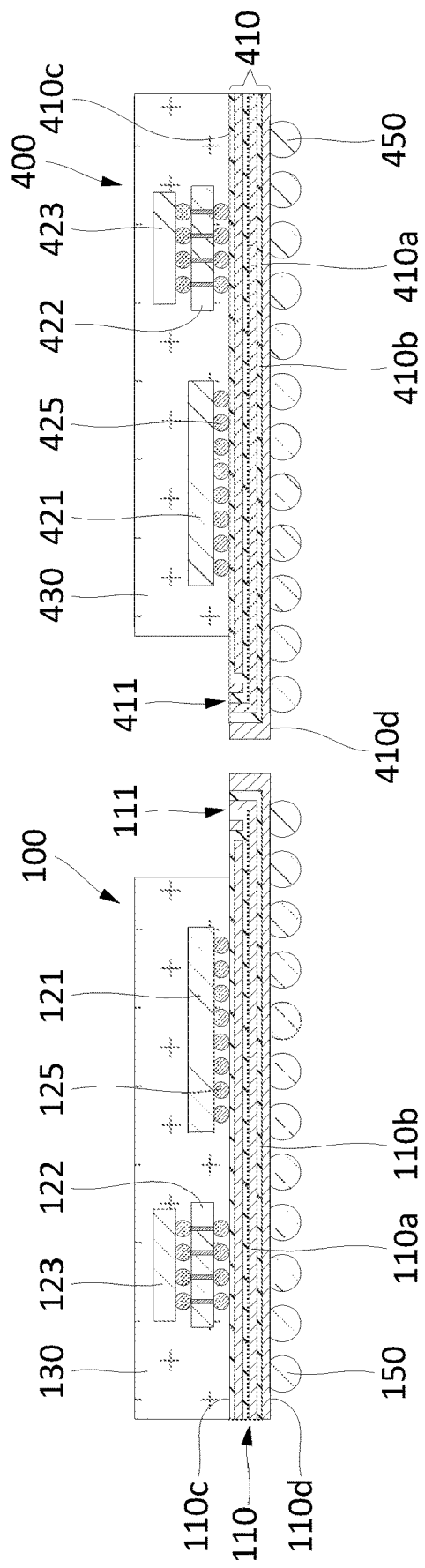
FIGS. 11A and 11B show cross-sectional views of an example method for manufacturing an example electronic assembly.
Figure 11B:
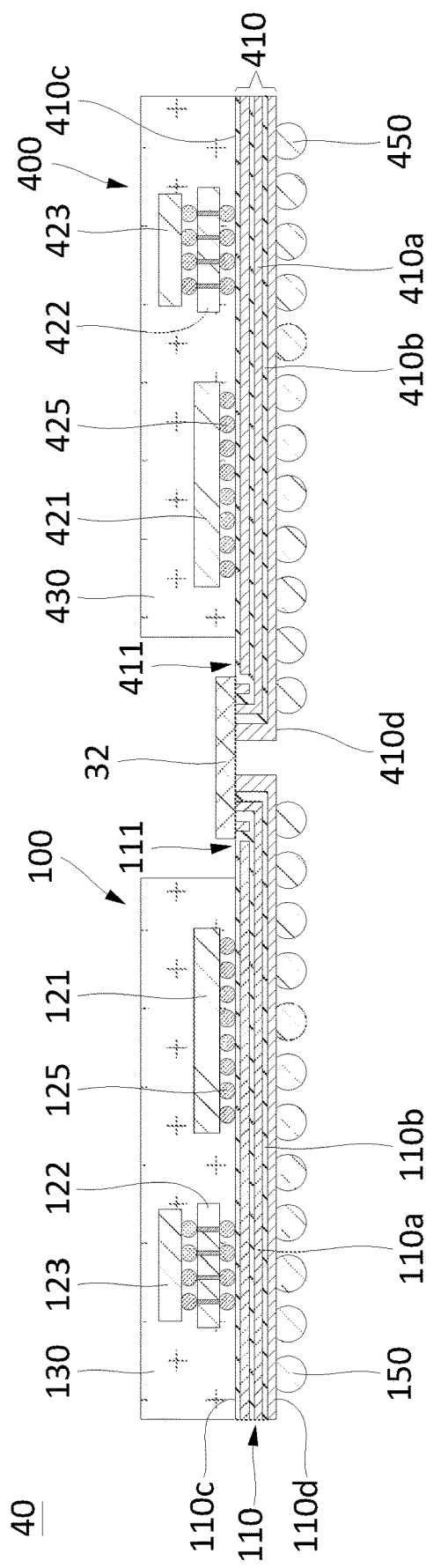

FIGS. 11A and 11B show cross-sectional views of an example method for manufacturing electronic assembly 40. FIG. 11A shows a cross-sectional view of electronic assembly 40 at an early stage of manufacture.

In the example shown in FIG. 11A, substrate tab 411 of semiconductor device 400 can be adjacent to substrate tab 111 of semiconductor device 100. In some examples, substrate tab 111 can be spaced apart from substrate tab 411. In other examples, substrate tab 111 can contact substrate tab 411.

FIG. 11B shows a cross-sectional view of electronic assembly 40 at a later stage of manufacture. In the example the example shown in FIG. 11B, interconnect 32 can be coupled to substrate tabs 111 and 411. In some examples, a mass reflow process, a thermal compression process, or a laser assist bonding process can be used to attach interconnect 32 to substrate tabs 111 and 411, electrically couple components of device 100 to the conductive pattern of interconnect 32, electrically couple components of device 400 to the conductive pattern of interconnect 32, or electrically couple components of device 100 to components of device 400.

In some examples, semiconductor device 400 can be coupled to semiconductor device 100. In some examples, substrate tabs 111 and 411 can be coupled to the bottom surface of interconnect 32, and substrate tabs 111 and 411 can be electrically and mechanically coupled to each other through interconnect 32. In some examples, substrate tab 111 contacts a first portion of the bottom surface of interconnect 32 and substrate tab 411 contacts a second portion of the bottom surface of interconnect 32. In some examples, interconnect 32 and substrate tabs 111 and 411 can provide an electrical path between semiconductor devices 100 and 400. In some examples, a mass reflow process, a thermal compression process, or a laser assist bonding process can be used to attach interconnect 32 to tabs 111 and 411 to or to electrically couple components of device 100 to components of device 400. Interconnect 32 of electronic assembly 40 can provide relatively lower thermal resistance and relatively higher performance due to a relatively shorter electrical path compared to other electronic assemblies.

Figure 12:
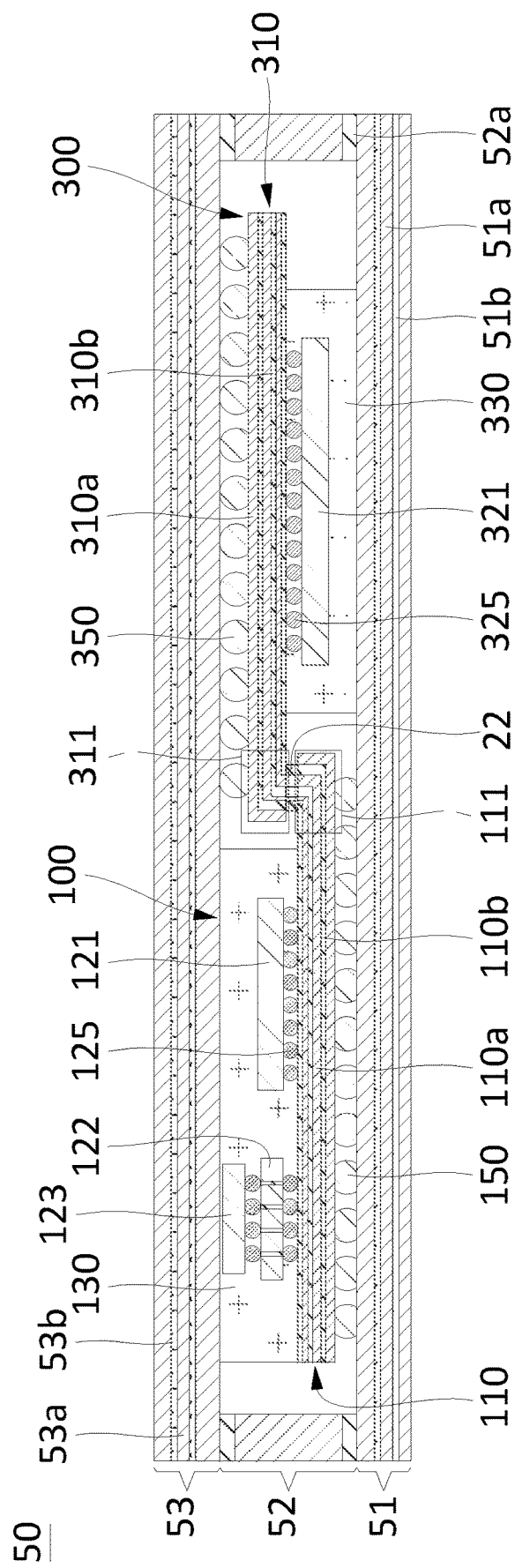
FIG. 12 shows a cross-sectional view of an example electronic assembly.

FIG. 12 shows a cross-sectional view of an example electronic assembly 50. In the example shown in FIG. 12, electronic assembly 50 can comprise an electrical interconnect 22, a support structure 51, an intermediate structure 52, a support structure 53, and semiconductor devices 100 and 300. In some examples, a base structure can comprise support structure 51, support structure 53, and intermediate structure 52 between support structure 51 and support structure 53. Semiconductor device 100 can be coupled to a top surface of support structure 51, and semiconductor device 300 can be coupled to a top surface of the support structure 53. Semiconductor device 300 along with support structure 53 can be inverted with respect to semiconductor device 100 and support structure 51 with substrate tab 311 of semiconductor device 300 being over substrate tab 111 of semiconductor device 100 to facilitate coupling of the substrate tabs via interconnect 22.

In some examples, support structures 51 and 53 can comprise dielectric structures 51a and 53a, respectively. Support structures 51 and 53 can comprise conductive structures 51b and 53b, respectively. Intermediate structure 42 can comprise a dielectric structure and conductive structures 52a. In some examples, intermediate structure 52 can be between support structure 51 and support structure 53.

Figure 13A:
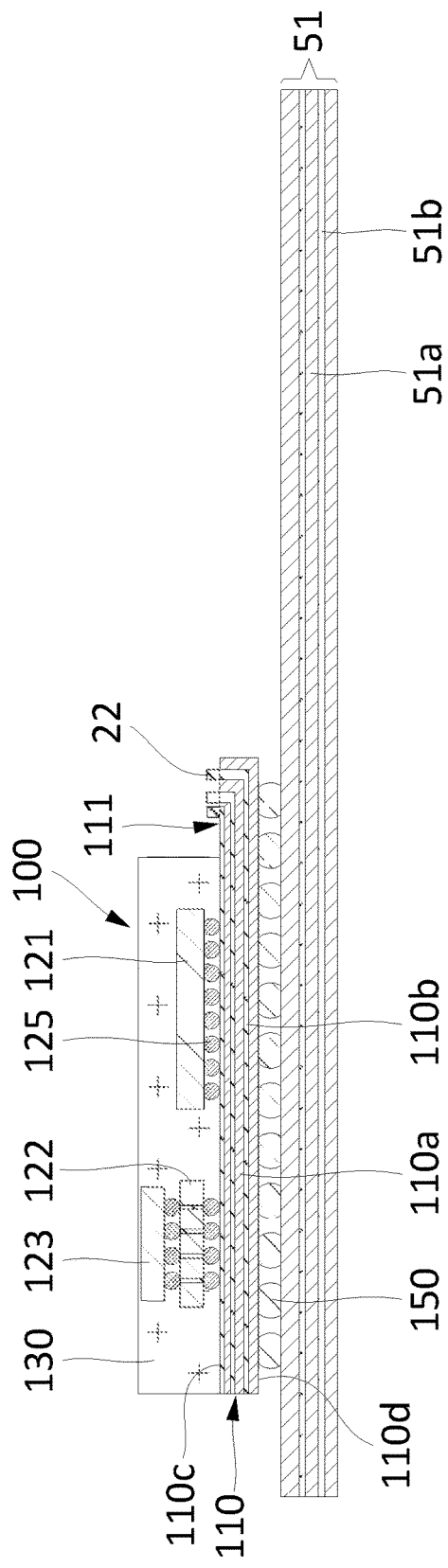
FIGS. 13A to 13D show cross-sectional views of an example method for manufacturing an example electronic assembly.

FIGS. 13A to 13D show cross-sectional views of an example method for manufacturing electronic assembly 50. FIG. 13A shows a cross-sectional view of electronic assembly 50 at an early stage of manufacture.

In the example shown in FIG. 13A, support structure 51 can comprise dielectric structure 51a and conductive structure 51b. In some examples, support structure 51 can comprise or be referred to as a liquid crystal polymer, pre-formed substrate, an RDL substrate, a printed circuit board, a cavity substrate, a printed wiring board, a multi-layered substrate, a through hole substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate, or a molded lead frame.

In some examples, dielectric structure 51a can have planar top and bottom surfaces. The top and bottom surfaces of dielectric structure 51a can be parallel with the top and bottom surfaces of support structure 51. In some examples, dielectric structure 51a can be referred to as a dielectric layer or a core layer. Dielectric structure 51a can include one or more dielectric layers. In some examples, dielectric structure 51a can comprise epoxy resin, phenolic resin, glass epoxy, polyimide, polyester, an epoxy molding compound, ceramic, bismaleimide triazine (BT), or FR4. Conductive structure 51b can be coupled to dielectric structure 51a. In some examples, conductive structure 51b can be referred to as a conductor, a conductive material, a conductive via, a circuit pattern, a trace or a wiring pattern.

In the example shown in FIG. 13A, semiconductor device 100 can be on a portion of the top surface of support structure 51. Semiconductor device 100 can be electrically coupled to conductive structure 51b of support structure 51. In some examples, a mass reflow process, a thermal compression process or a laser assist bonding process can be used to attach interconnects 150 to support structure 51 or to electrically couple interconnects 150 to conductive structure 51b of base structure 51.

Figure 13B:
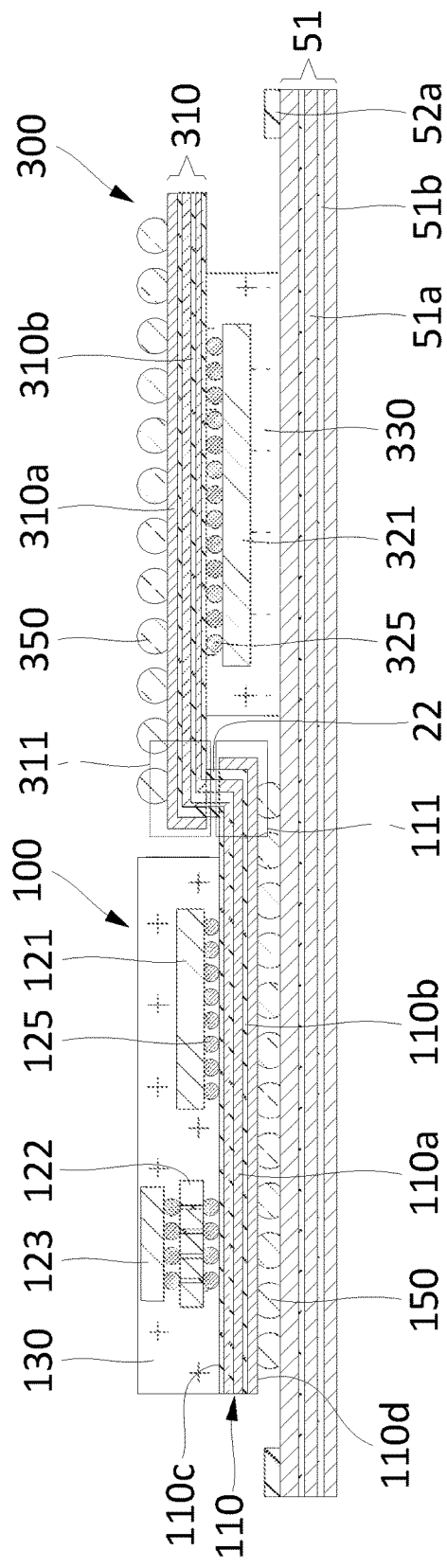

FIG. 13B shows a cross-sectional view of electronic assembly 50 at a later stage of manufacture. In the example shown in FIG. 13B, semiconductor device 300 can be coupled to semiconductor device 100. In some examples, substrate tab 311 of semiconductor device 300 can be coupled to interconnect 22 after interconnect 22 is formed or provided on tab 111, and substrate tabs 111 and 311 can be electrically and mechanically coupled to each other through interconnect 22. In some examples, substrate tab 311 is over substrate tab 111, and interconnect 22 and substrate tabs 111 and 311 can provide an electrical path between semiconductor devices 100 and 300. In some examples, a mass reflow process, a thermal compression process, or a laser assist bonding process can be used to attach tab 311 to interconnect 22 or to electrically couple components of device 100 to components of device 300. Interconnect 22 of electronic assembly 50 can provide relatively lower thermal resistance and relatively higher performance due to a relatively shorter electrical path compared to other electronic assemblies.

Figure 13C:
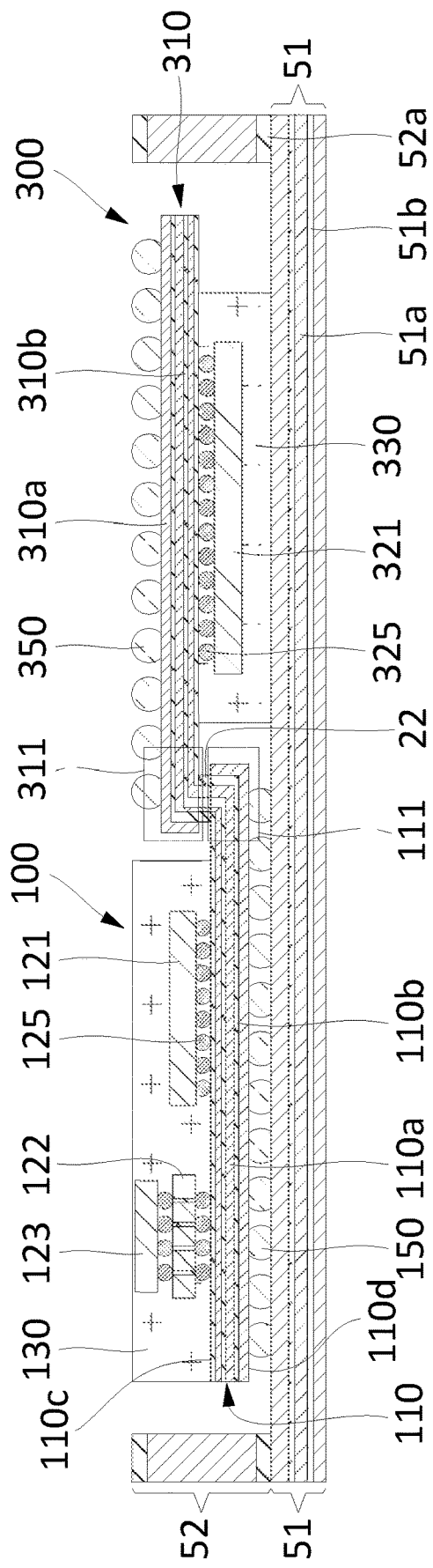

FIG. 13C shows a cross-sectional view of electronic assembly 50 at a later stage of manufacture. In the example shown in FIG. 13C, intermediate structures 52 can be coupled to a top surface of support structure 51. In some examples, intermediate structure 52 can be a single integral rectangular structure. In other examples, intermediate structure 52 can comprise multiple spaced-apart components.

In some examples, intermediate structure 52 can comprise or be referred to as a liquid crystal polymer, pre-formed substrate, an RDL substrate, a printed circuit board, a cavity substrate, a printed wiring board, a multi-layered substrate, a through hole substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate, or a molded lead frame. In some examples, intermediate structure 52 can have a top surface and a bottom surface and can comprise conductive patterns on its top and bottom surfaces. In some examples, a mass reflow process, a thermal compression process, or a laser assist bonding process can be used to attach intermediate structure 52 to support structure 51, electrically couple components of devices 100 and 300 to the conductive patterns of intermediate structure 52, or electrically couple conductive structure 52a to conductive structure 51b. In other examples, intermediate structure 52 can be coupled to support structure 51 using an adhesive.

Figure 13D:
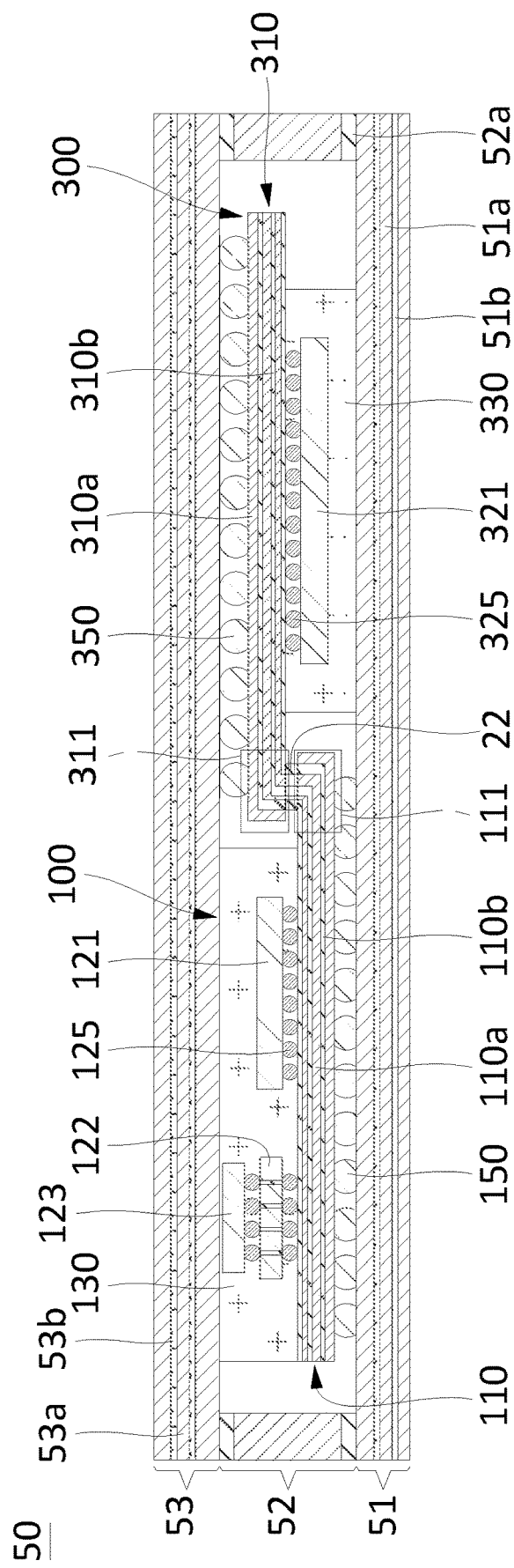

FIG. 13D shows a cross-sectional view of electronic assembly 50 at a later stage of manufacture. In the example shown in FIG. 13D, support structure 53 can be on intermediate structure 52, device 100, or device 300. Support structure 53 can comprise dielectric structure 53a and conductive structure 53b In some examples, support structure 53 can comprise or be referred to as a liquid crystal polymer, pre-formed substrate, an RDL substrate, a printed circuit board, a cavity substrate, a printed wiring board, a multi-layered substrate, a through hole substrate, a rigid substrate, a flexible substrate, a glass epoxy substrate, a polyimide substrate, a polyester substrate, a molded plastic substrate, a ceramic substrate, an etched foil process substrate, an additive process substrate, a buildup substrate, or a molded lead frame.

In some examples, dielectric structure 53a can have planar top and bottom surfaces. The top and bottom surfaces of dielectric structure 53a can be parallel with the top and bottom surfaces of support structure 53. In some examples, dielectric structure 53a can be referred to as a dielectric layer or a core layer. Dielectric structure 53a can include one or more dielectric layers. In some examples, dielectric structure 53a can comprise epoxy resin, phenolic resin, glass epoxy, polyimide, polyester, an epoxy molding compound, ceramic, bismaleimide triazine (BT), or FR4. Conductive structure 53b can be coupled to dielectric structure 53a. In some examples, conductive structure 53b can be referred to as a conductor, a conductive material, a conductive via, a circuit pattern, a trace or a wiring pattern.

In some examples, semiconductor device 300 can be electrically coupled to conductive structure 53b of support structure 53. In some examples, a mass reflow process, a thermal compression process or a laser assist bonding process can be used to attach interconnects 350 to support structure 53, electrically couple interconnects 350 to conductive structure 53b of base structure 53, or electrically couple conductive structure 52a to conductive structure 53b.

In other examples, intermediate structure 52 can be coupled to support structure 53 using an adhesive.

Figure 14:
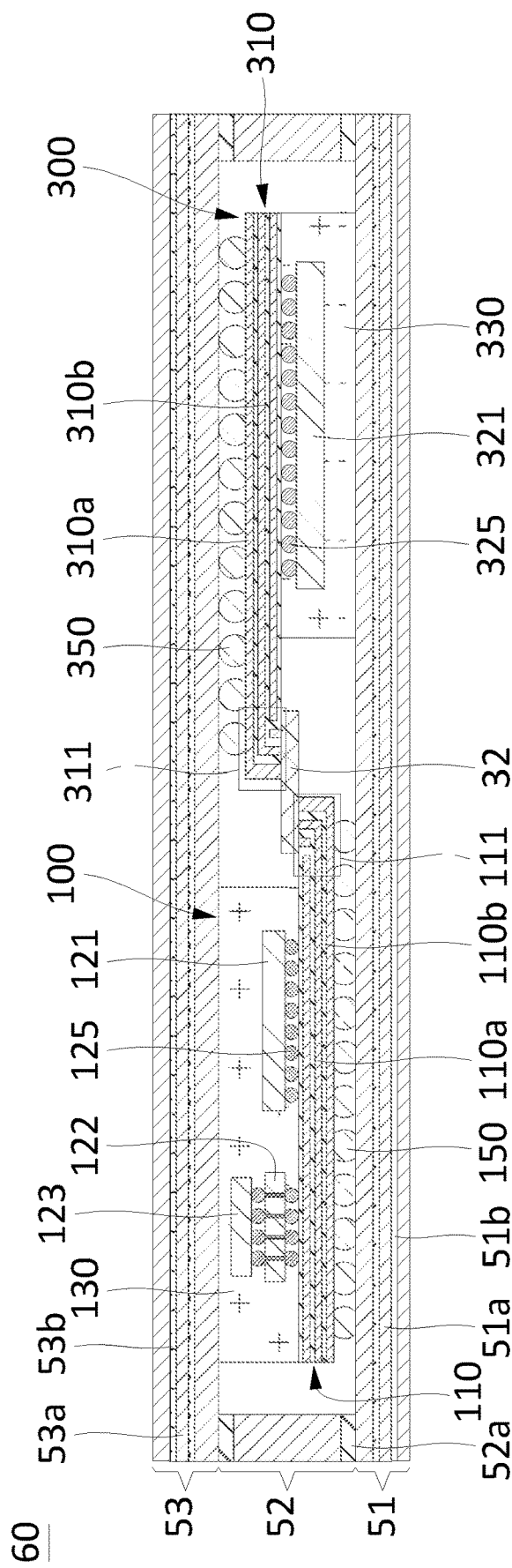
FIG. 14 shows a cross-sectional view of an example electronic assembly.

FIG. 14 shows a cross-sectional view of an example electronic assembly 60. In the example shown in FIG. 14, electronic assembly 60 can comprise interconnect 32, support structure 51, intermediate structure 52, support structure 53, and semiconductor devices 100 and 300.

Figure 15C:
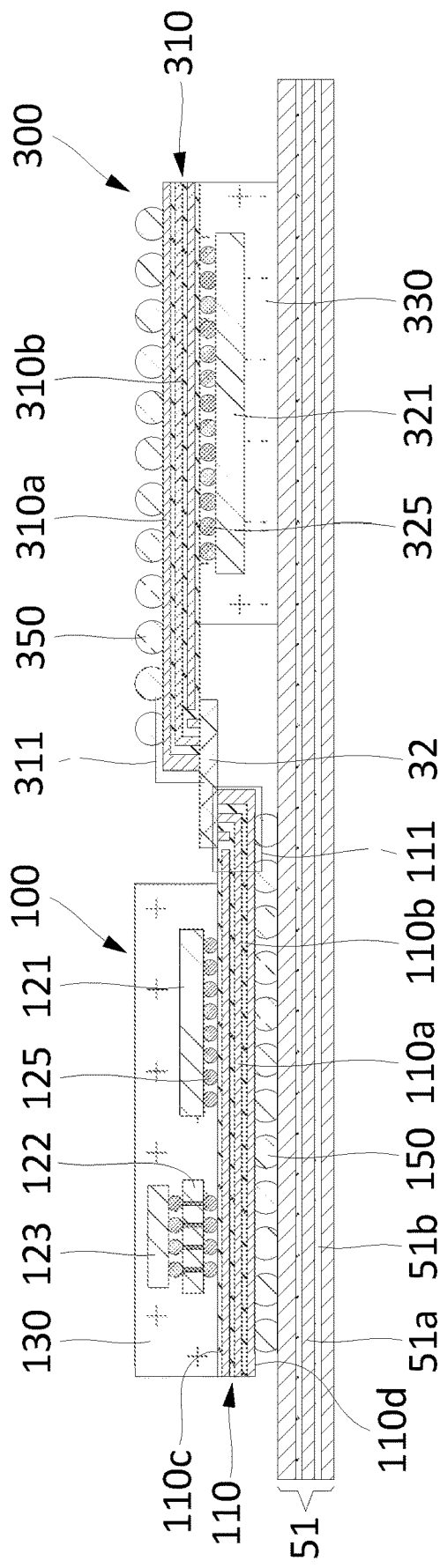

FIGS. 15A to 15E show cross-sectional views of an example method for manufacturing electronic assembly 60. FIG. 15A shows a cross-sectional view of electronic assembly 60 at an early stage of manufacture.

In the example shown in FIG. 15A, semiconductor device 100 can be on a portion of the top surface of support structure 51. Semiconductor device 100 can be electrically coupled to conductive structure 51b. In some examples, a mass reflow process, a thermal compression process or a laser assist bonding process can be used to attach interconnects 150 to support structure 51 or to electrically couple interconnects 150 to conductive structure 51b of base structure 51.

FIG. 15B shows a cross-sectional view of electronic assembly 60 at a later stage of manufacture. In the example shown in FIG. 15B, interconnect 32 can be on substrate tab 111 of semiconductor device 100. In some examples, a mass reflow process, a thermal compression process, or a laser assist bonding process can be used to attach interconnect 32 to substrate tab 111 of semiconductor device 100 or to electrically couple components of device 100 to the conductive pattern of interconnect 32.

FIG. 15C shows a cross-sectional view of electronic assembly 30 at a later stage of manufacture. In the example shown in FIG. 15C, semiconductor device 300 can be coupled to semiconductor device 100. In some examples, substrate tab 311 of semiconductor device 300 can be coupled to the top surface of interconnect 32, and substrate tabs 111 and 311 can be electrically and mechanically coupled to each other through interconnect 32. In some examples, substrate tab 111 contacts a first portion of interconnect 32 and substrate tab 311 contacts a second portion of interconnect 32. In some examples, substrate tab 111 contacts a bottom surface of interconnect 32 and substrate tab 311 contacts a top surface of interconnect 32. In some examples, interconnect 32 and substrate tabs 111 and 311 can provide an electrical path between semiconductor devices 100 and 300. In some examples, a mass reflow process, a thermal compression process, or a laser assist bonding process can be used to attach tab 311 to interconnect 32 or to electrically couple components of device 100 to components of device 300. Interconnect 32 of electronic assembly 60 can provide relatively lower thermal resistance and relatively higher performance due to a relatively shorter electrical path compared to other electronic assemblies.

Figure 15D:
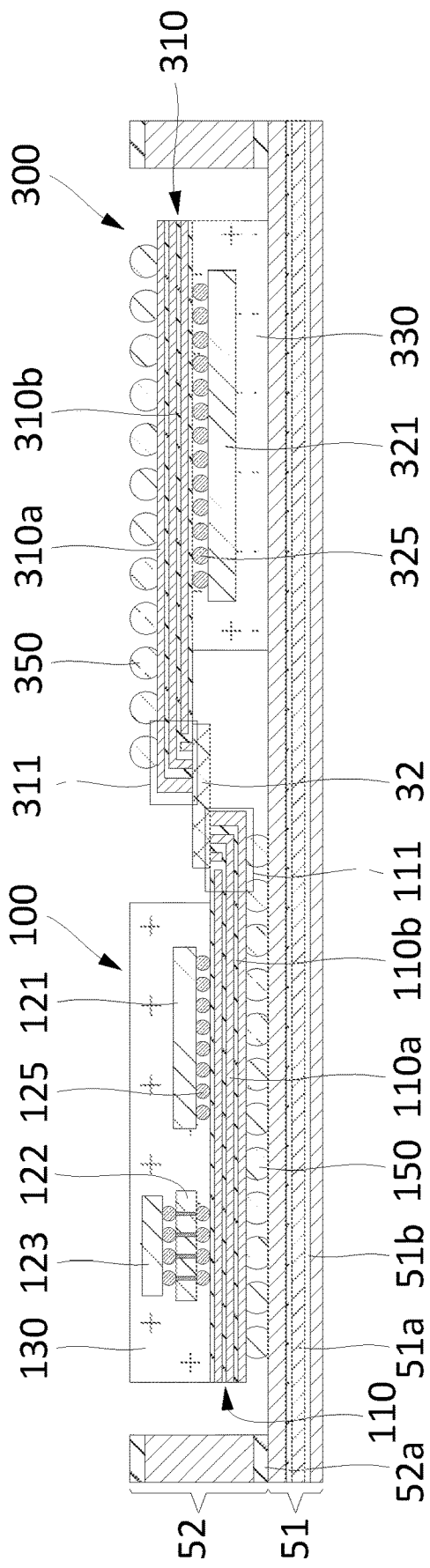

FIG. 15D shows a cross-sectional view of electronic assembly 50 at a later stage of manufacture. In the example shown in FIG. 15D, intermediate structures 52 can be coupled to the top surface of support structure 51. In some examples, intermediate structure 52 can be a single integral rectangular structure. In other examples, intermediate structure 52 can comprise multiple spaced-apart components.

Figure 15E:
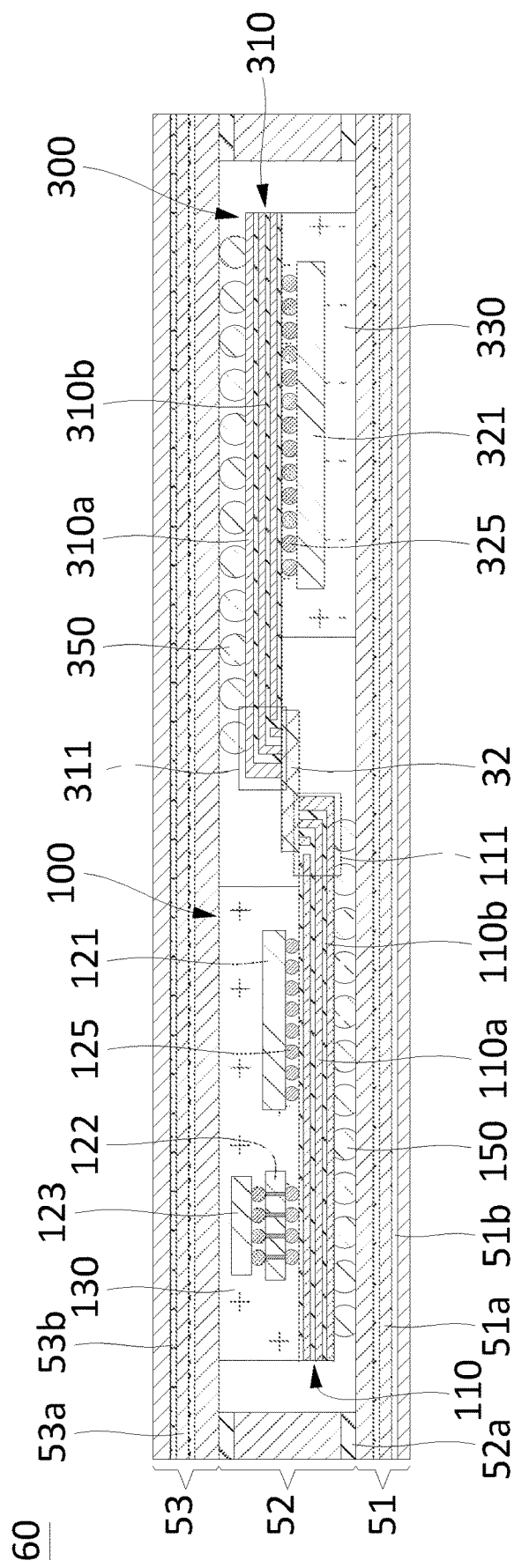

FIG. 15E shows a cross-sectional view of electronic assembly 60 at a later stage of manufacture. In the example shown in FIG. 15E, support structure 53 can be on intermediate structure 52, device 100, or device 300.

In some examples, semiconductor device 300 can be electrically coupled to conductive structure 53b of support structure 53. In some examples, a mass reflow process, a thermal compression process or a laser assist bonding process can be used to attach interconnects 350 to support structure 53, electrically couple interconnects 350 to conductive structure 53b of support structure 53, or electrically couple conductive structure 52a to conductive structure 53b. In other examples, intermediate structure 52 can be coupled to support structure 53 using an adhesive.

The present disclosure includes reference to certain examples. It will be understood by those skilled in the art, however, that various changes may be made, and equivalents may be substituted without departing from the scope of the disclosure. In addition, modifications may be made to the disclosed examples without departing from the scope of the present disclosure. Therefore, it is intended that the present disclosure is not limited to the examples disclosed, but that the disclosure will include all examples falling within the scope of the appended claims.

The invention claimed is:

1. An electronic assembly, comprising:
   a first semiconductor device and a second semiconductor device, wherein each of the first semiconductor device and the second semiconductor devices comprises:
      a substrate comprising a top surface and a conductive structure;
      an electronic component over the top surface of the substrate;
      a dielectric material over the top surface of the substrate and contacting a side of the electronic component;
      wherein the substrate comprises a substrate tab at an end of the substrate and not covered by the dielectric material, wherein the substrate tab comprises a portion of the substrate that extends beyond a lateral side of the dielectric material, and wherein the conductive structure of the substrate is exposed at the substrate tab; and
   an interconnect electrically coupled to the conductive structure at the substrate tab of the first semiconductor device and the conductive structure at the substrate tab of the second semiconductor device, wherein the interconnect overlaps the substrate tab of the first semiconductor device and the substrate tab of the second semiconductor device.

2. The electronic assembly of claim 1, further comprising a base structure comprising a top surface, wherein the first semiconductor device is over the top surface of the base structure and the second semiconductor device is over the top surface of the base structure.

3. The electronic assembly of claim 2, wherein:
   the base structure comprises a first support structure, a second support structure, and an intermediate structure between the first support structure and the second support structure,
   the first semiconductor device is coupled to a top surface of the first support structure and the second semiconductor device is coupled to a top surface of the second support structure, and
   the second semiconductor device is inverted with respect to the first semiconductor device with the substrate tab of the second semiconductor device over the substrate tab of the second semiconductor device.

4. The electronic assembly of claim 1, wherein the interconnect comprises a wire bond.

5. The electronic assembly of claim 1, wherein the interconnect comprises a clip.

6. The electronic assembly of claim 1, wherein the second semiconductor device is inverted with respect to the first semiconductor device and the substrate tab of the second semiconductor device is over the substrate tab of the first semiconductor device.

7. The electronic assembly of claim 6, wherein the interconnect comprises solder.

8. The electronic assembly of claim 6, wherein the interconnect comprises a copper pillar.

9. The electronic assembly of claim 1, wherein the interconnect comprises an interconnect substrate.

10. The electronic assembly of claim 1, wherein the interconnect comprises a flexible substrate.

11. The electronic assembly of claim 1, wherein the interconnect comprises a lead frame.

\* \* \* \* \*